(12) United States Patent
Rajashekhar et al.

(10) Patent No.: US 11,984,395 B2
(45) Date of Patent: May 14, 2024

(54) SEMICONDUCTOR DEVICE CONTAINING BIT LINES SEPARATED BY AIR GAPS AND METHODS FOR FORMING THE SAME

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Rahul Sharangpani, Fremont, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 93 days.

(21) Appl. No.: 17/479,637

(22) Filed: Sep. 20, 2021

(65) Prior Publication Data

US 2023/0090951 A1 Mar. 23, 2023

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76805* (2013.01); *H01L 21/7682* (2013.01);
(Continued)

(58) Field of Classification Search
CPC ............ H01L 23/5226; H01L 23/5283; H01L 23/5329; H01L 23/535; H01L 23/5222;
(Continued)

(56) References Cited

U.S. PATENT DOCUMENTS 8,125,018 B2 2/2012 Melik-Martirosian et al.
9,515,085 B2 12/2016 Rabkin et al.
(Continued)

FOREIGN PATENT DOCUMENTS

KR        10-0664339 B1    1/2007
KR   10-2008-0000817 A    1/2008

OTHER PUBLICATIONS

Machine Translation of KR10-0664339; Dec. 26, 2006. (Year: 2006).*

(Continued)

*Primary Examiner* — Shahed Ahmed
*Assistant Examiner* — Vicki B. Booker
(74) *Attorney, Agent, or Firm* — THE MARBURY LAW GROUP PLLC

(57) ABSTRACT

A semiconductor structure includes semiconductor devices located over a substrate, bit lines electrically connected to the semiconductor devices and having a respective reentrant vertical cross-sectional profile within a vertical plane that is perpendicular to a lengthwise direction along which the bit lines laterally extend, and dielectric portions that are interlaced with the bit lines along a horizontal direction that is perpendicular to the lengthwise direction. The dielectric portions may contain air gaps. A bit-line-contact via structure can be formed on top of a bit line. In some embodiments, dielectric cap strips may be located on top surface of the dielectric portions and may cover peripheral regions of the top surfaces of the bit lines without covering middle regions of the top surfaces of the bit lines.

10 Claims, 43 Drawing Sheets

(51) Int. Cl.
  *H01L 23/528* (2006.01)
  *H01L 23/532* (2006.01)
  *H01L 23/535* (2006.01)
  *H10B 41/27* (2023.01)
  *H10B 43/27* (2023.01)

(52) U.S. Cl.
  CPC .... *H01L 21/76895* (2013.01); *H01L 23/5283* (2013.01); *H01L 23/5329* (2013.01); *H01L 23/535* (2013.01); *H10B 41/27* (2023.02); *H10B 43/27* (2023.02)

(58) Field of Classification Search
  CPC ......... H01L 23/53295; H01L 21/76805; H01L 21/7682; H01L 21/76895; H01L 21/76829; H01L 21/76897; H01L 21/76885; H10B 41/27; H10B 43/10; H10B 43/27
  See application file for complete search history.

(56) References Cited

U.S. PATENT DOCUMENTS

| | | | |
|---|---|---|---|
| 10,115,459 | B1 | 10/2018 | Yamada et al. |
| 2012/0058639 | A1 | 3/2012 | Sim et al. |
| 2012/0241837 | A1 | 9/2012 | Takashima |
| 2015/0255122 | A1 | 9/2015 | Toriyama |
| 2015/0372079 | A1 | 12/2015 | Naito et al. |
| 2016/0240476 | A1* | 8/2016 | Takahashi ........... H01L 23/5283 |
| 2017/0271581 | A1 | 9/2017 | Seong et al. |
| 2018/0108671 | A1* | 4/2018 | Yu ...................... H10B 43/27 |
| 2020/0020697 | A1 | 1/2020 | Kim et al. |
| 2021/0028149 | A1 | 1/2021 | Makala et al. |
| 2021/0082923 | A1 | 3/2021 | He et al. |
| 2021/0193585 | A1 | 6/2021 | Said et al. |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.
U.S. Appl. No. 17/094,543, filed Nov. 10, 2020, SanDisk Technologies, LLC.
U.S. Appl. No. 17/208,019, filed Mar. 22, 2021, SanDisk Technologies, LLC.
Rajashekhar, A. et al., "Semiconductor Device Containing Bit Lines Separated by Air Gaps and Methods for Forming The Same," U.S. Appl. No. 17/479,573, filed Sep. 20, 2021.
Ahmed, S.R.A. et al., "Characterization of Low-Dielectric Constant Silicon Carbonitride (SiCN) Dielectric Films for Charge Trapping Nonvolatile Memories," ECS Transactions, vol. 69, No. 3, pp. 99-109 (2015), DOI: 10.1149/06903.0099ecst.
Lee, J. et al., "Characteristics of low-K SiOC films deposited via atomic layer deposition," Thin Solid Films, vol. 645, pp. 334-339, (2018), https://doi.org/10.1016/j.tsf.2017.10.045.
Prasad, K. et al., "Evaluation of diffusion barrier layers in Cu interconnects," 2002 Conference on Optoelectronic and Microelectronic Materials and Devices. Commad 2002. Proceedings (Cat. No.02EX601), Sydney, NSW, Australia, 2002, pp. 373-376, doi: 10.1109/COMMAD.2002.1237268.
Sondhi, K. et al., "Area selective deposition of ruthenium on 3D structures," Journal of Vacuum Science & Technology A, vol. 40, 062412, (2022), https://doi.org/10.1116/6.0002148.
Yu, X. et al., "Area-Selective Molecular Layer Deposition of a Silicon Oxycarbide Low k Dielectric," Chem. Mater., vol. 33, No. 3, pp. 902-909, (2021), DOI: 10.1021/acs.chemmater.0c03668.
Notification of Transmittal of The International Search Report and Written Opinion of the International Searching Authority for International Patent Application No. PCT/US2022/029073, mailed Oct. 17, 2022, 12 pages.
USPTO Office Communication, Non-Final Office Action, U.S. Appl. No. 17/479,573, mailed Mar. 6, 2024, 30 pages.

\* cited by examiner

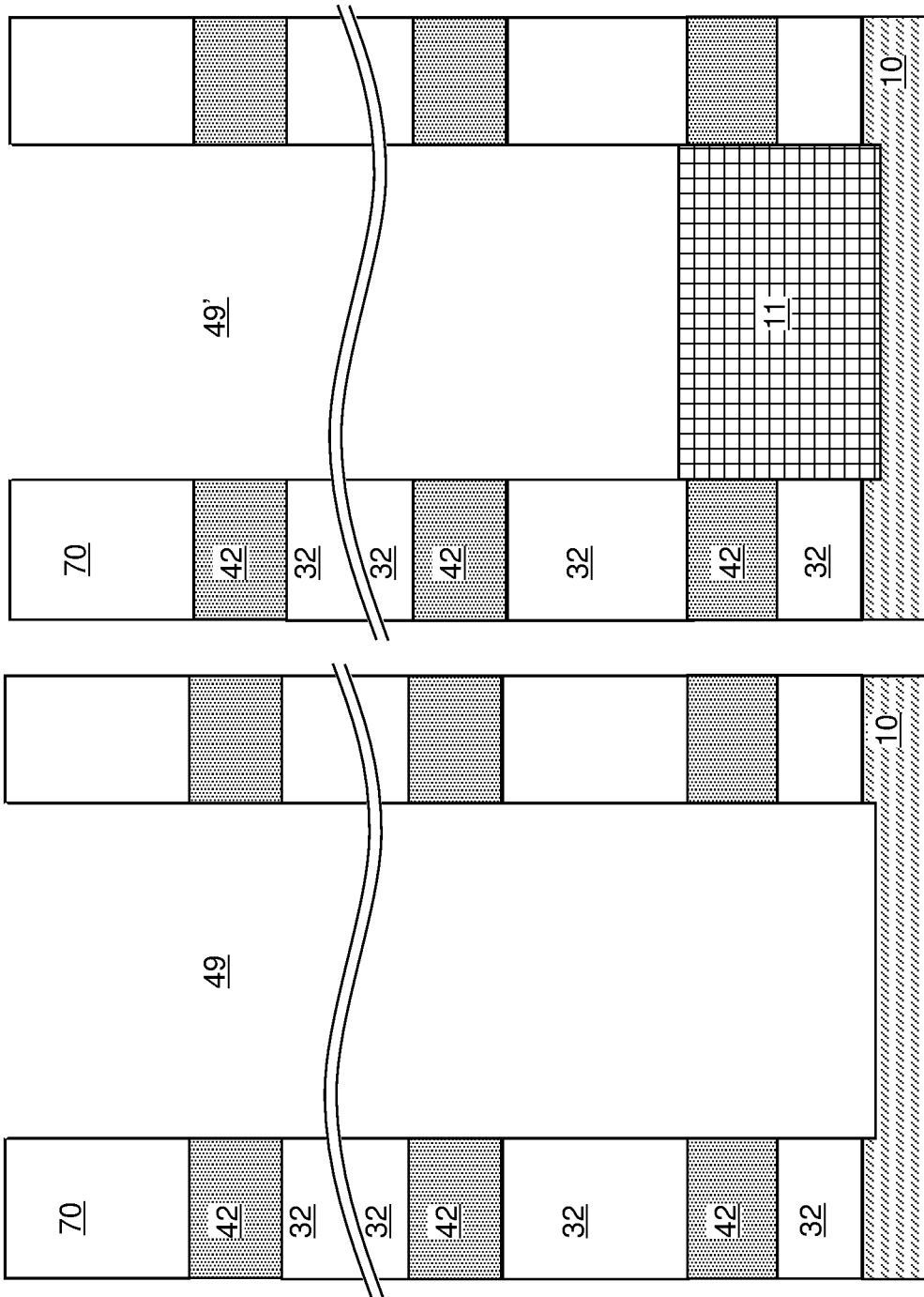

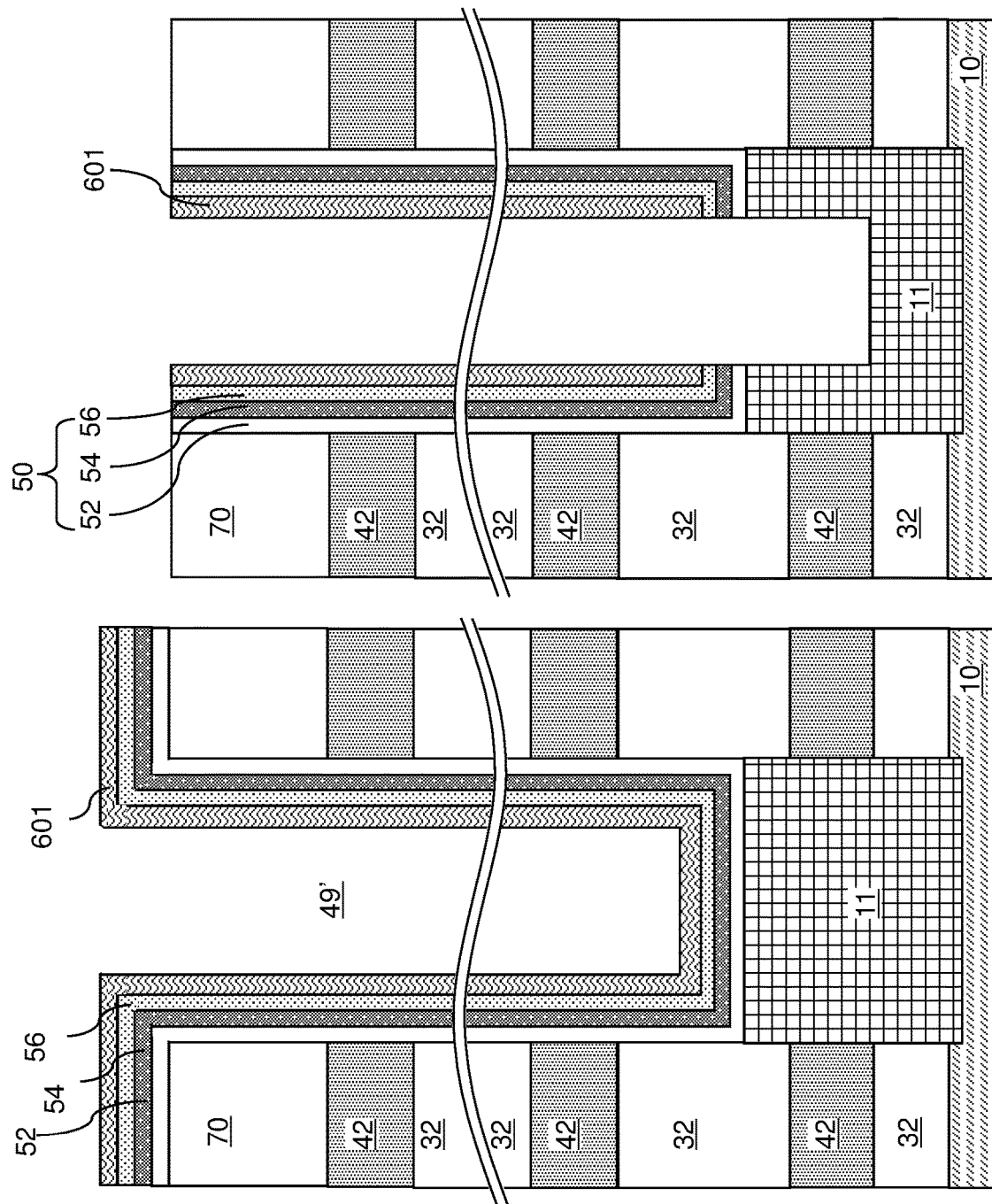

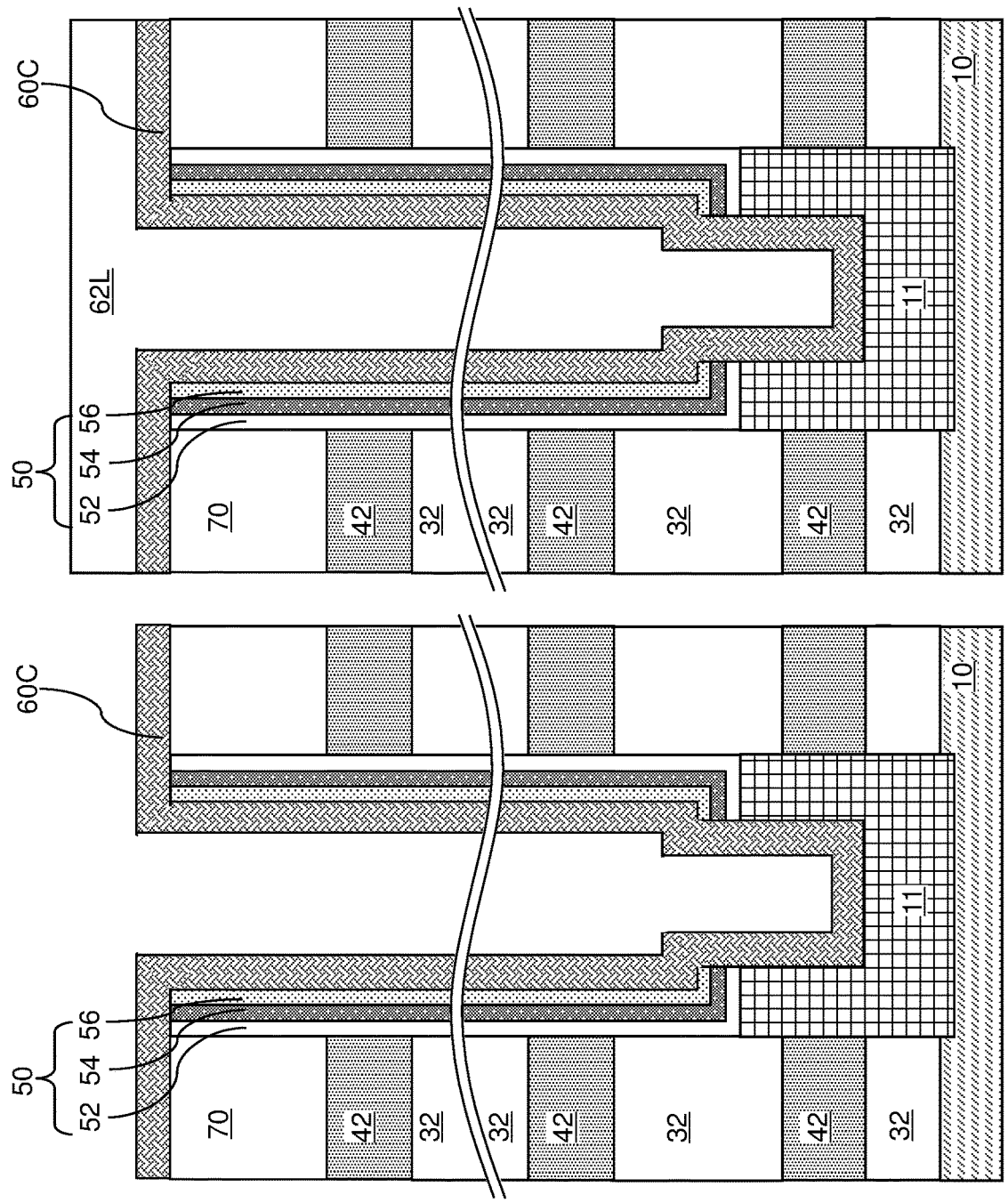

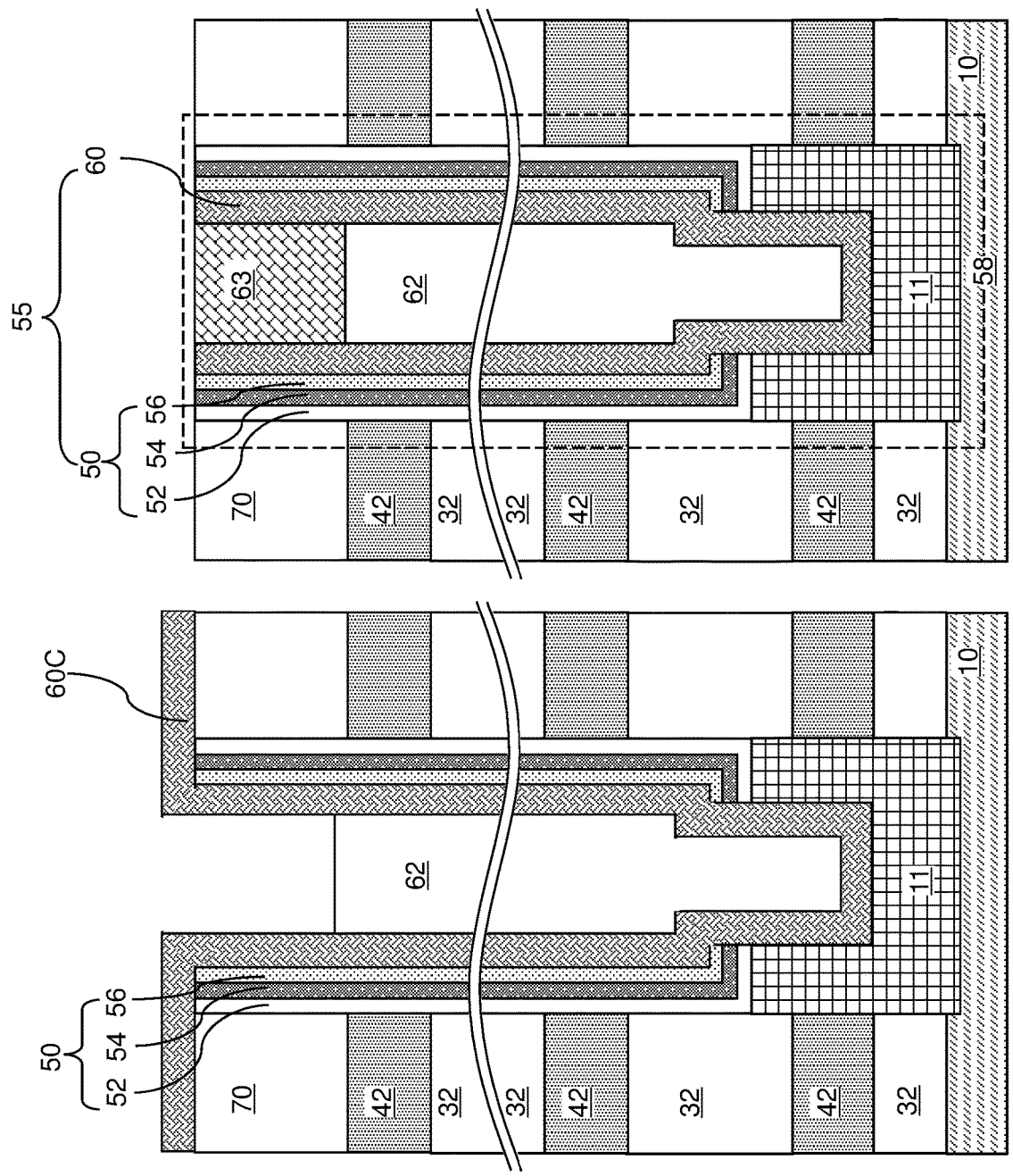

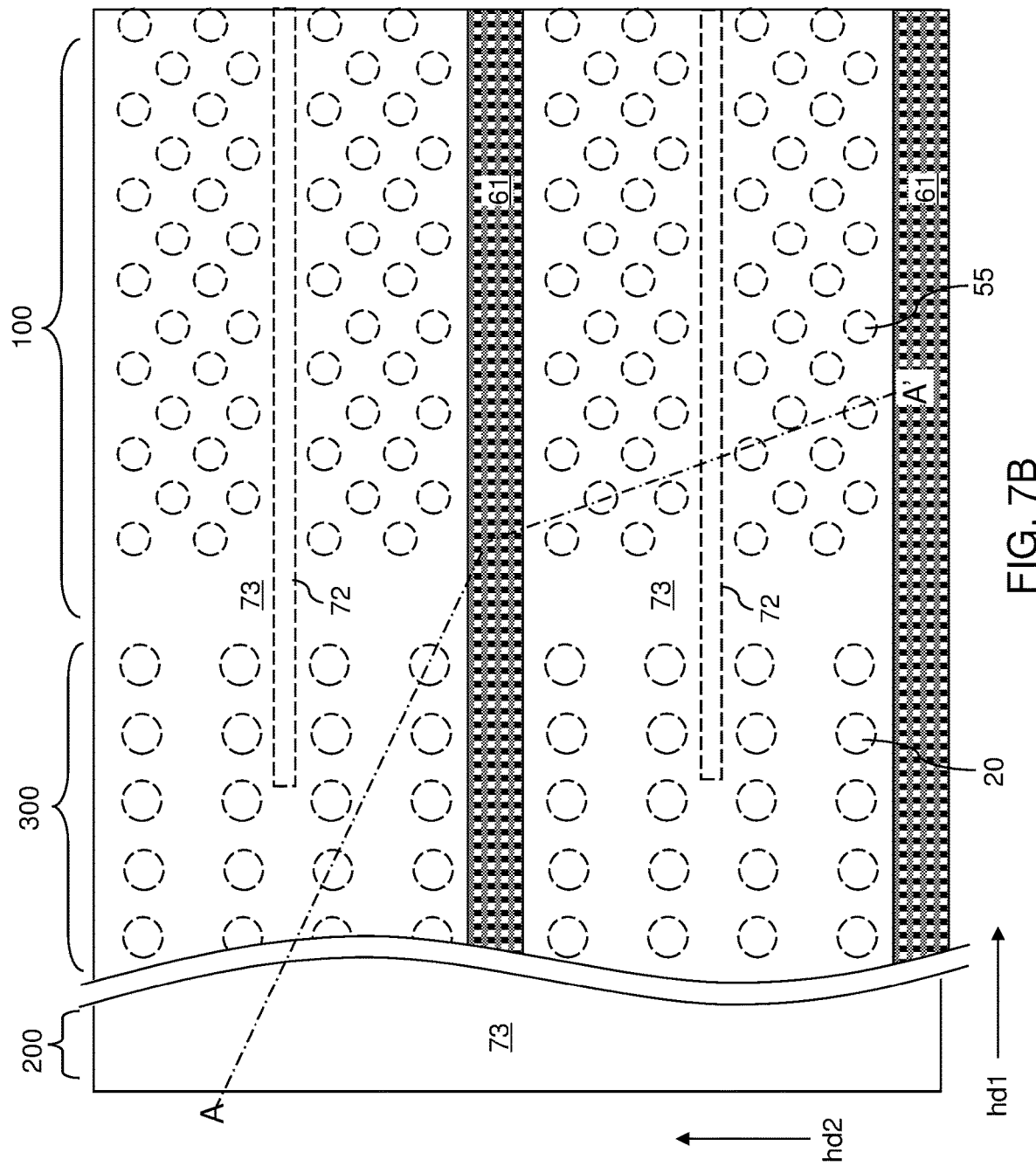

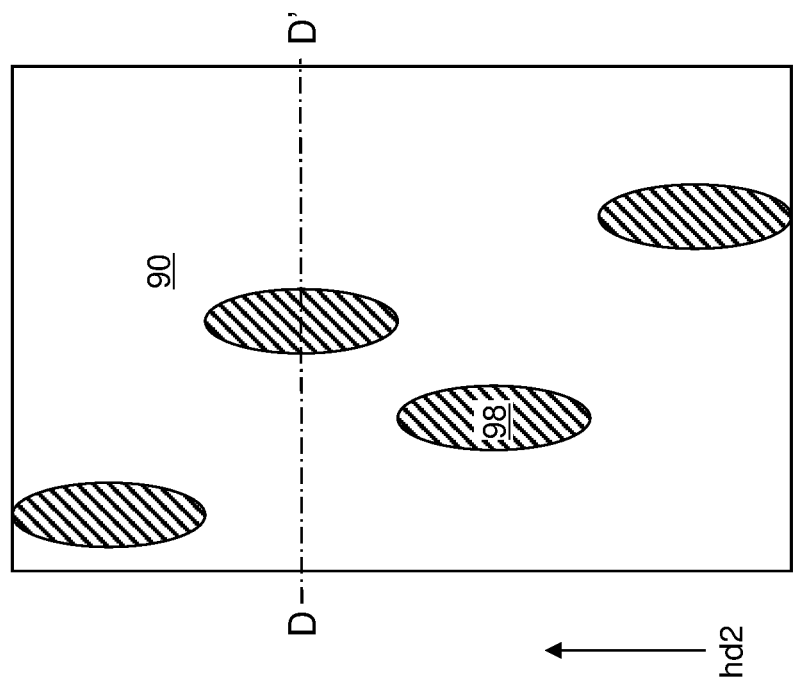
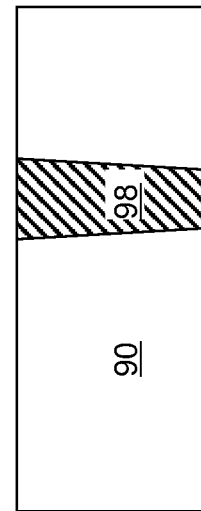

SEMICONDUCTOR DEVICE CONTAINING BIT LINES SEPARATED BY AIR GAPS AND METHODS FOR FORMING THE SAME

FIELD

The present disclosure relates generally to the field of semiconductor devices, and particularly to a semiconductor device containing bit lines separated by air gaps and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: semiconductor devices located over a substrate; bit lines electrically connected to the semiconductor devices and having a respective reentrant vertical cross-sectional profile within a vertical plane that is perpendicular to a lengthwise direction along which the bit lines laterally extend; and cavity-containing dielectric portions containing air gaps that are interlaced with the bit lines along a horizontal direction that is perpendicular to the lengthwise direction.

According to another aspect of the present disclosure, a method of forming a semiconductor structure is provided, which comprises: forming semiconductor devices over a substrate; forming an electrically conductive material layer over the semiconductor devices; forming bit-line-capping dielectric rails over the electrically conductive material layer, wherein the bit-line-capping dielectric rails laterally extend along a lengthwise direction and are laterally spaced apart along a widthwise direction; patterning the electrically conductive material layer into bit lines by performing an etch process that laterally recesses bit line sidewalls such that the bit lines have a reentrant vertical cross-sectional profile; and anisotropically depositing a dielectric material between neighboring pairs of the bit lines to form cavity-containing dielectric portions containing air gaps that are interlaced with the bit lines along the widthwise direction.

According to yet another aspect of the present disclosure, a semiconductor structure is provided, which comprises: semiconductor devices located over a substrate; bit lines electrically connected to the semiconductor devices and having a respective reentrant vertical cross-sectional profile within a vertical plane that is perpendicular to a lengthwise direction along which the bit lines laterally extend; dielectric rails that are interlaced with the bit lines along a horizontal direction that is perpendicular to the lengthwise direction; and dielectric cap strips located on top surface of the dielectric rails and covering peripheral regions of the top surfaces of the bit lines and not covering middle regions of the top surfaces of the bit lines.

According to still another aspect of the present disclosure, a method of forming a semiconductor structure is provided, which comprises: forming semiconductor devices over a substrate; forming a laterally alternating sequence of bit lines and dielectric rails over the semiconductor devices, wherein the bit lines are electrically connected to a respective node of the semiconductor devices; forming dielectric cap strips on top surface of the dielectric rails by selectively growing a dielectric cap material from physically exposed surfaces of the dielectric rails while suppressing growth of the dielectric cap material from surfaces of the bit lines; forming a via-level dielectric layer over the dielectric cap strips; and forming a bit-line-contact via structure through the via-level dielectric layer on a top surface of one of the bit lines.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 7B is a partial see-through top-down view of the exemplary structure of FIG. 7A. The vertical plane A-A' is the plane of the schematic vertical cross-sectional view of FIG. 7A.

FIG. 14C is a top-down view of a region of the exemplary structure of FIG. 14A.

FIG. 14D is a vertical cross-sectional view of the exemplary structure along the vertical plane D-D' of FIG. 14C.

DETAILED DESCRIPTION

Figure 1:
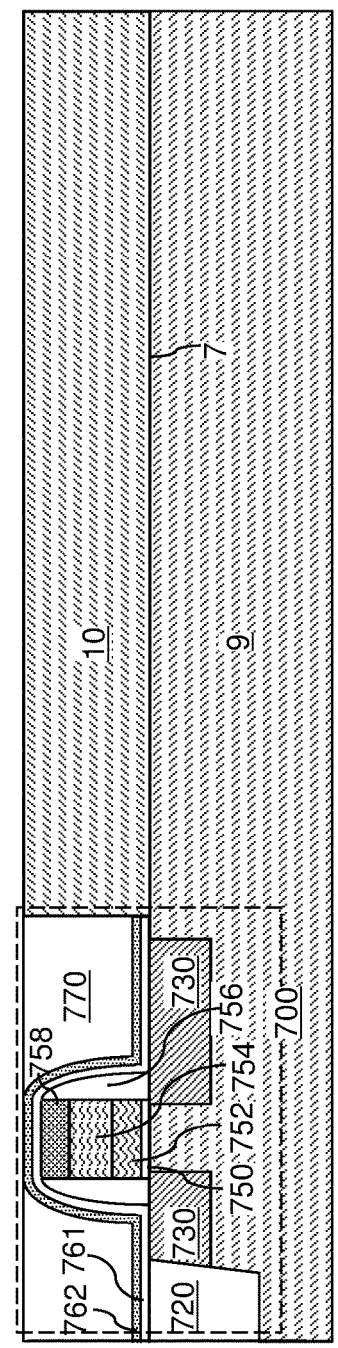
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a semiconductor device containing bit lines separated by air gaps and methods for forming the same, the various aspects of which are described below. The embodiments of the disclosure can be employed to form various semiconductor devices, non-limiting examples of which include three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
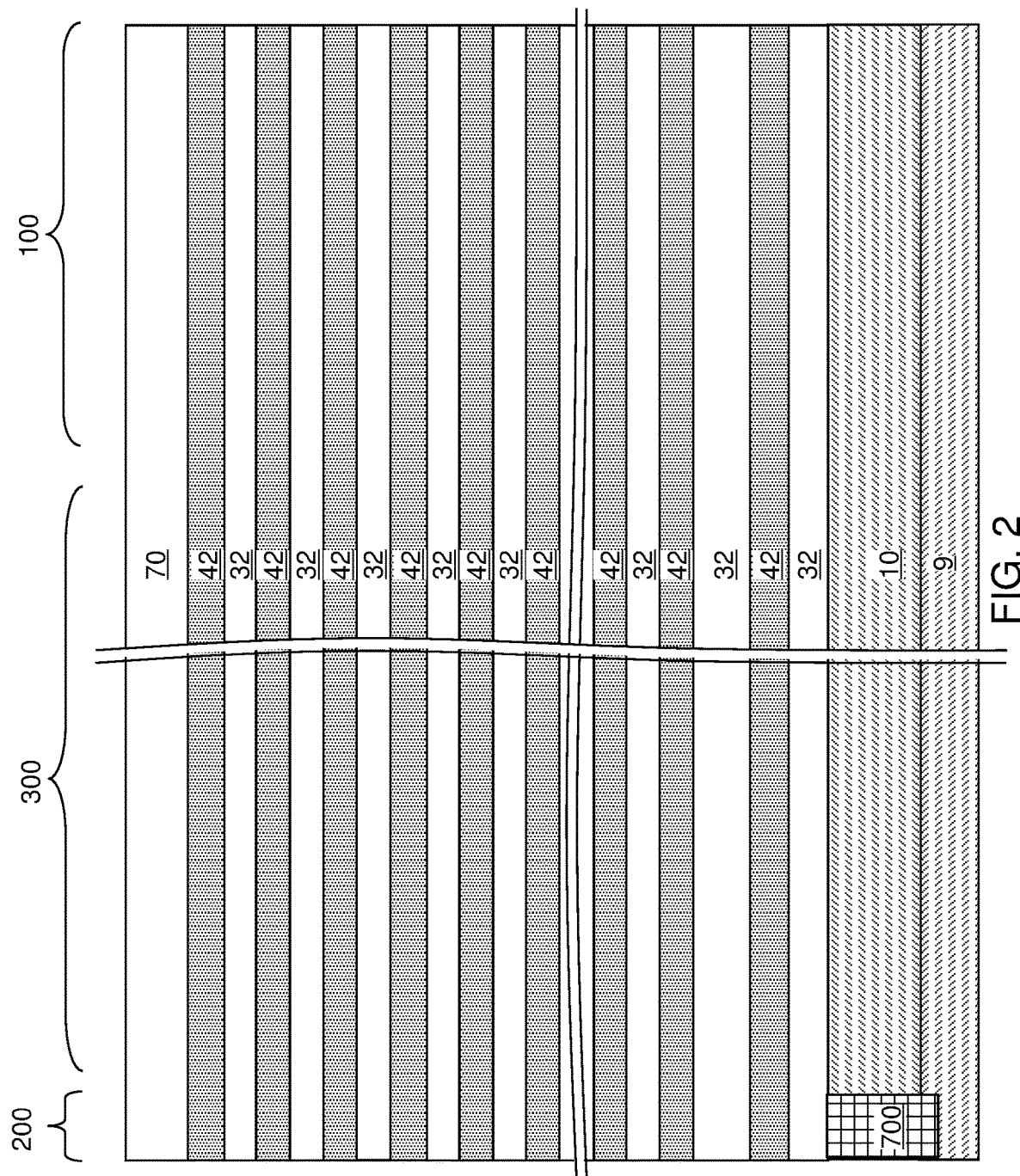
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
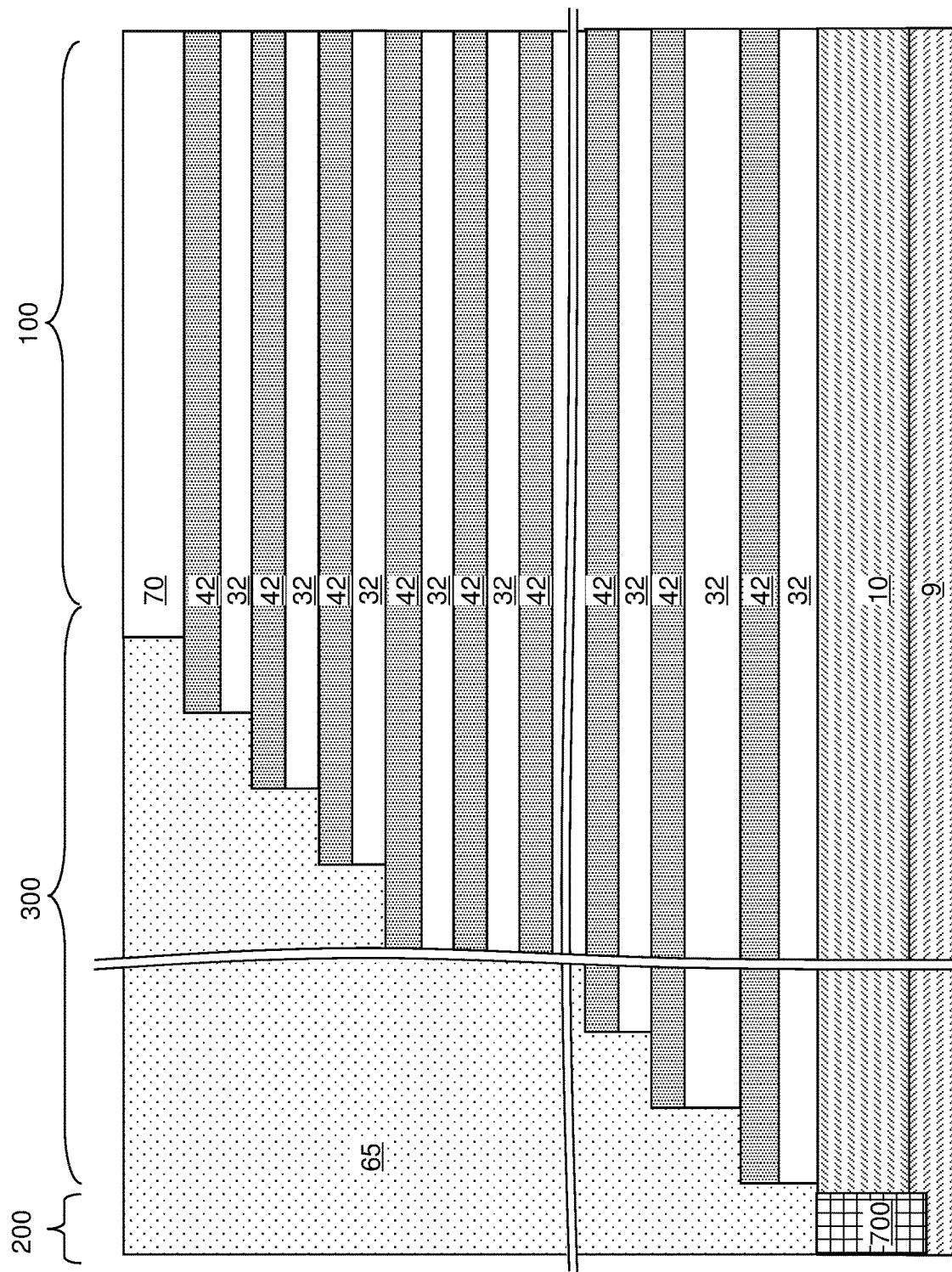
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
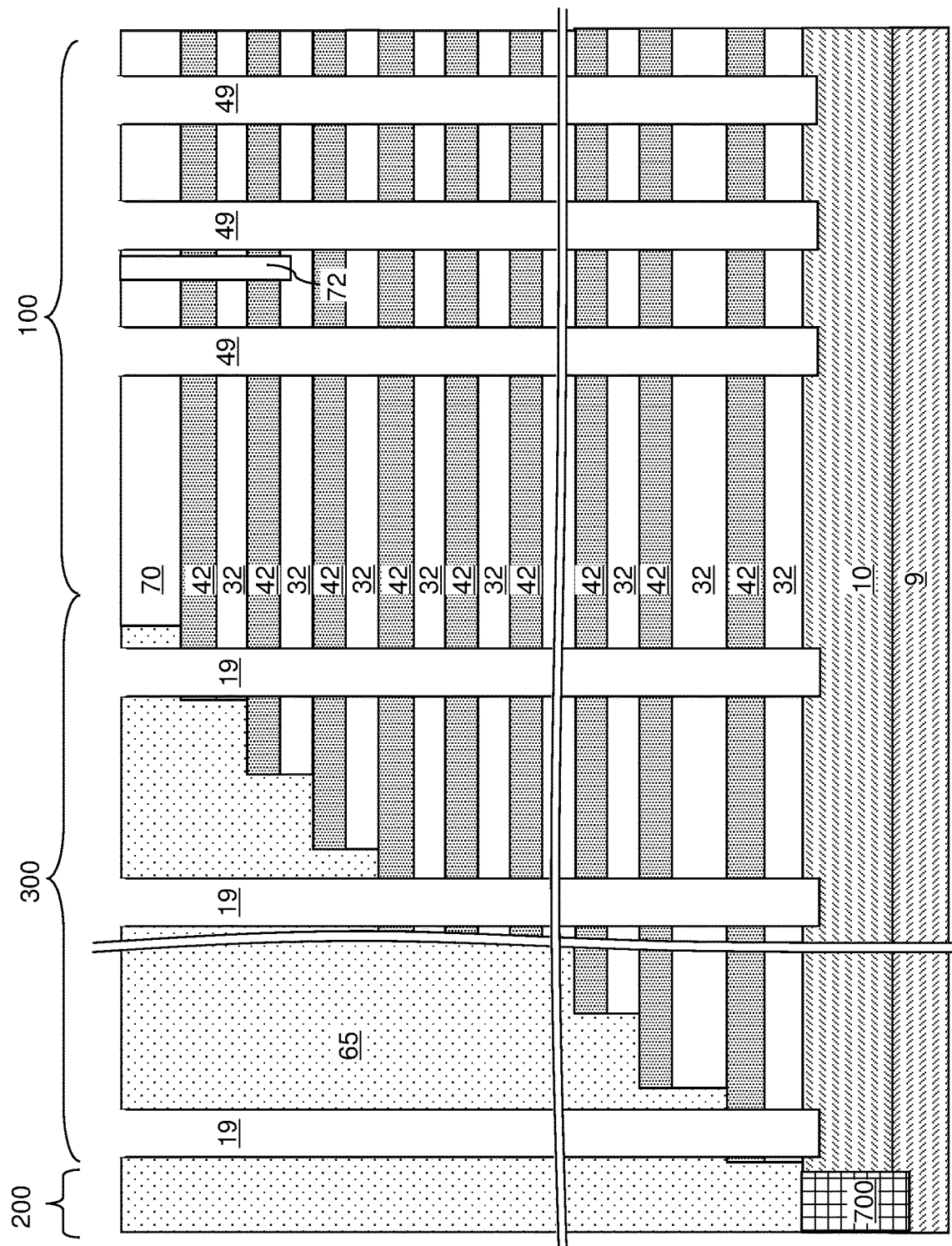
FIG. 4A is a schematic vertical cross-sectional view of the exemplary structure after formation of memory openings and support openings according to an embodiment of the present disclosure.
Figure 4B:
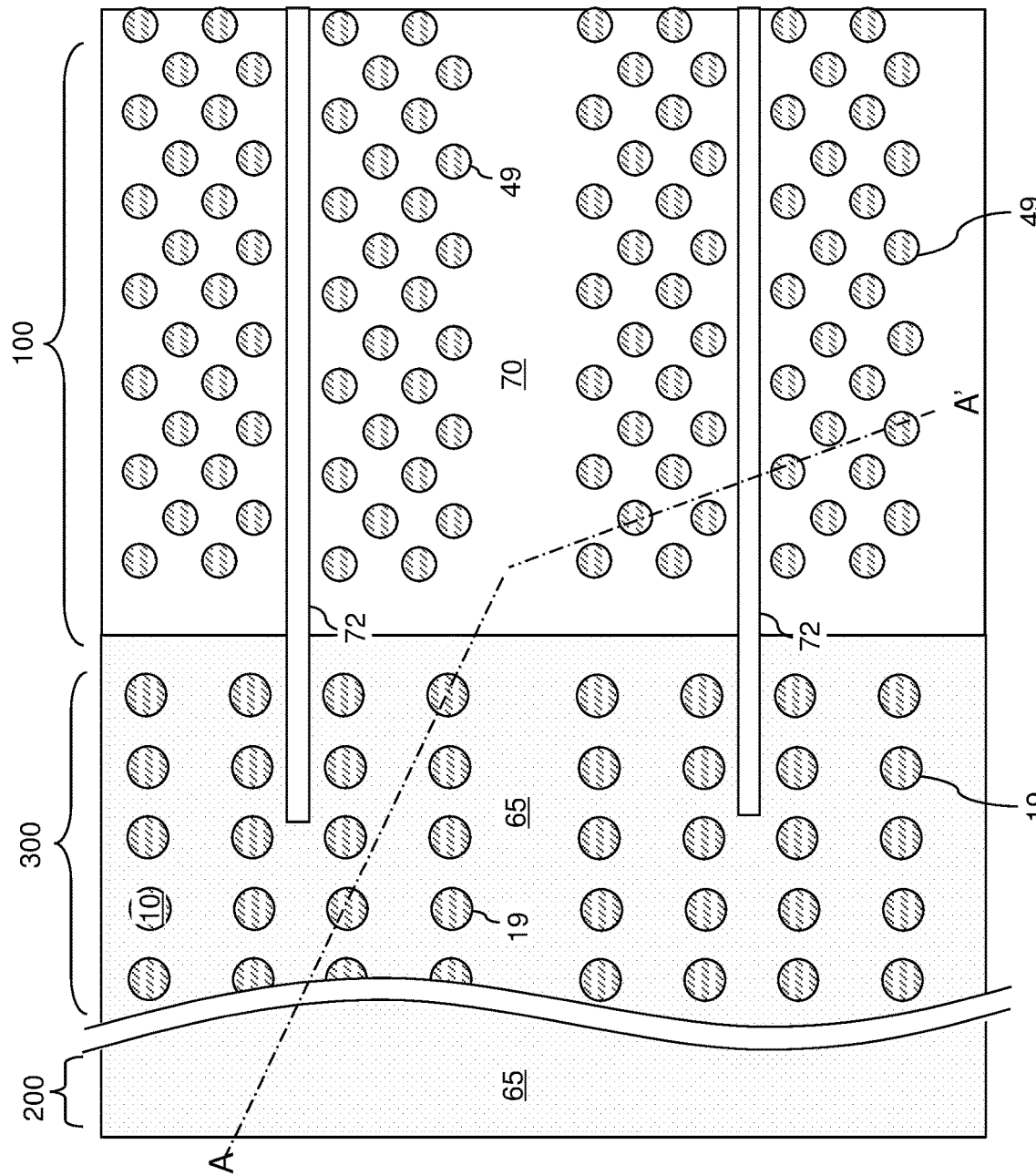
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a dielectric material liner 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

In one embodiment, the dielectric material liner 56 can include a gate dielectric material if the memory material layer 54 comprises a ferroelectric layer. In another embodiment, if the memory material layer 54 comprises a charge storage layer, then the dielectric material liner 56 may be a tunneling dielectric material including a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, the blocking dielectric layer 52 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 5F, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the dielectric material liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
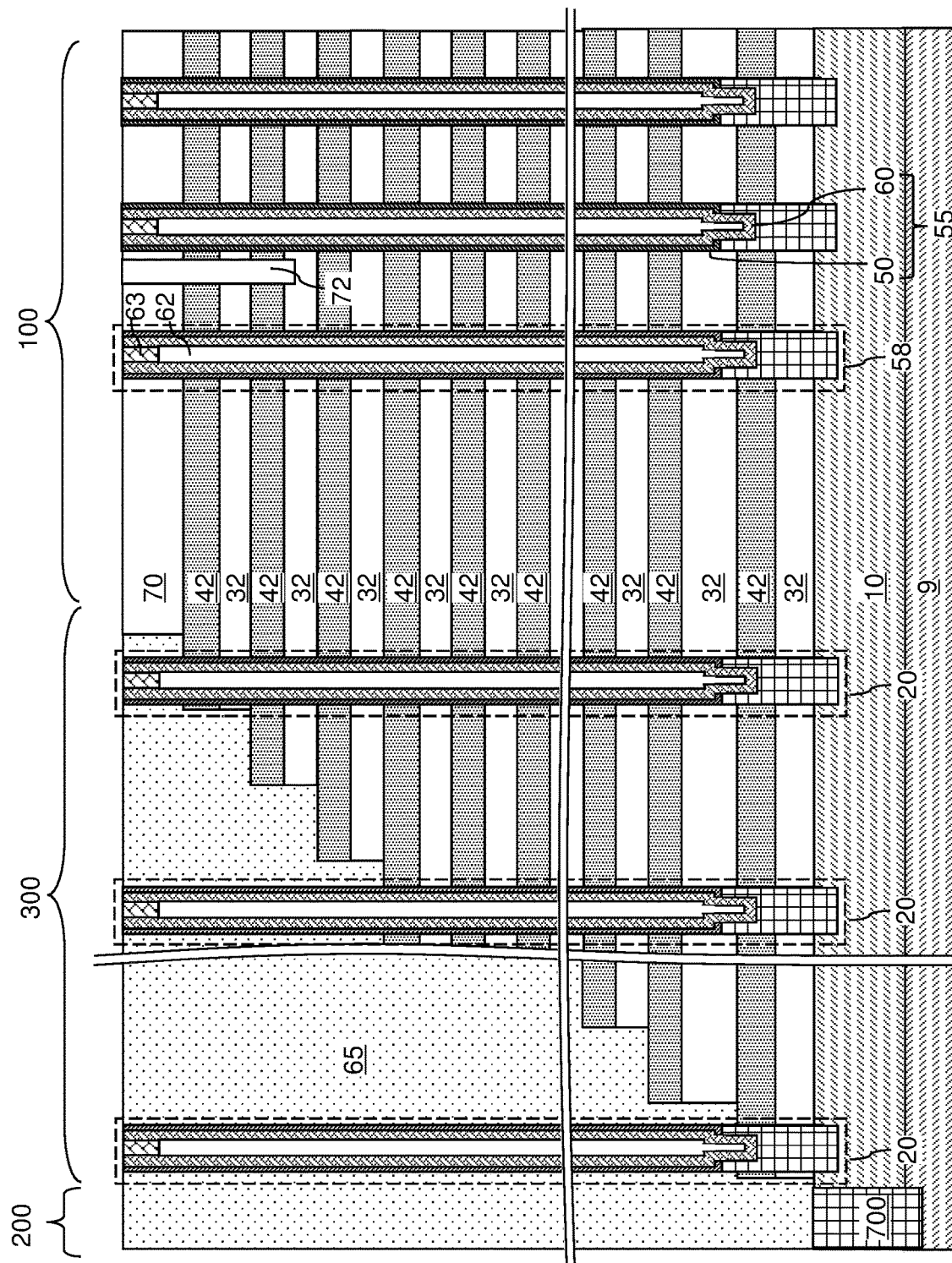
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60 and a vertical stack of charge storage regions or ferroelectric regions (comprising memory material layer 54) laterally surrounding the dielectric material liner 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
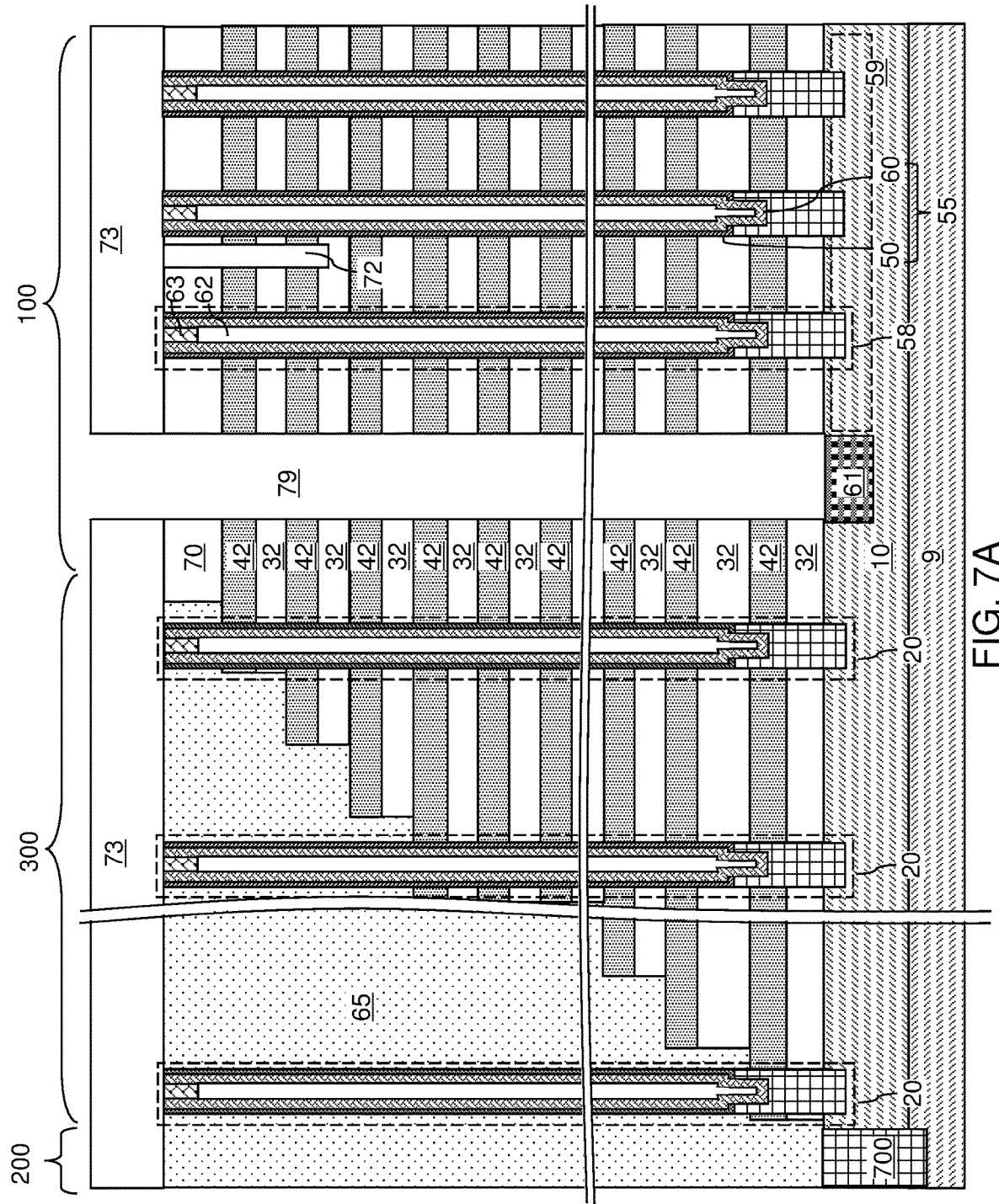
FIG. 7A is a schematic vertical cross-sectional view of the exemplary structure after formation of backside trenches according to an embodiment of the present disclosure.
Figure 7C:
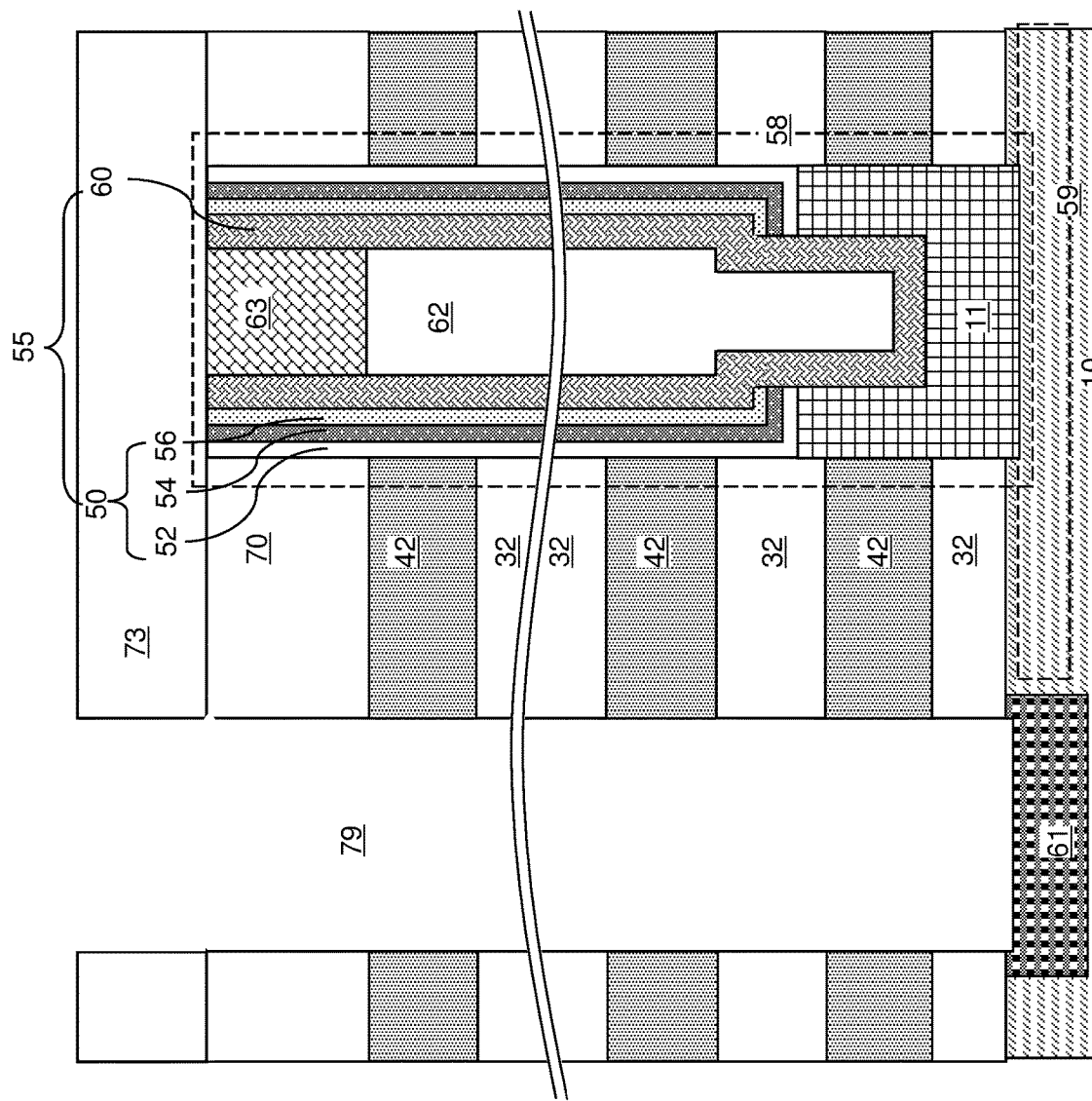
FIG. 7C is a magnified view of a region of the exemplary structure of FIG. 7A.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8A:
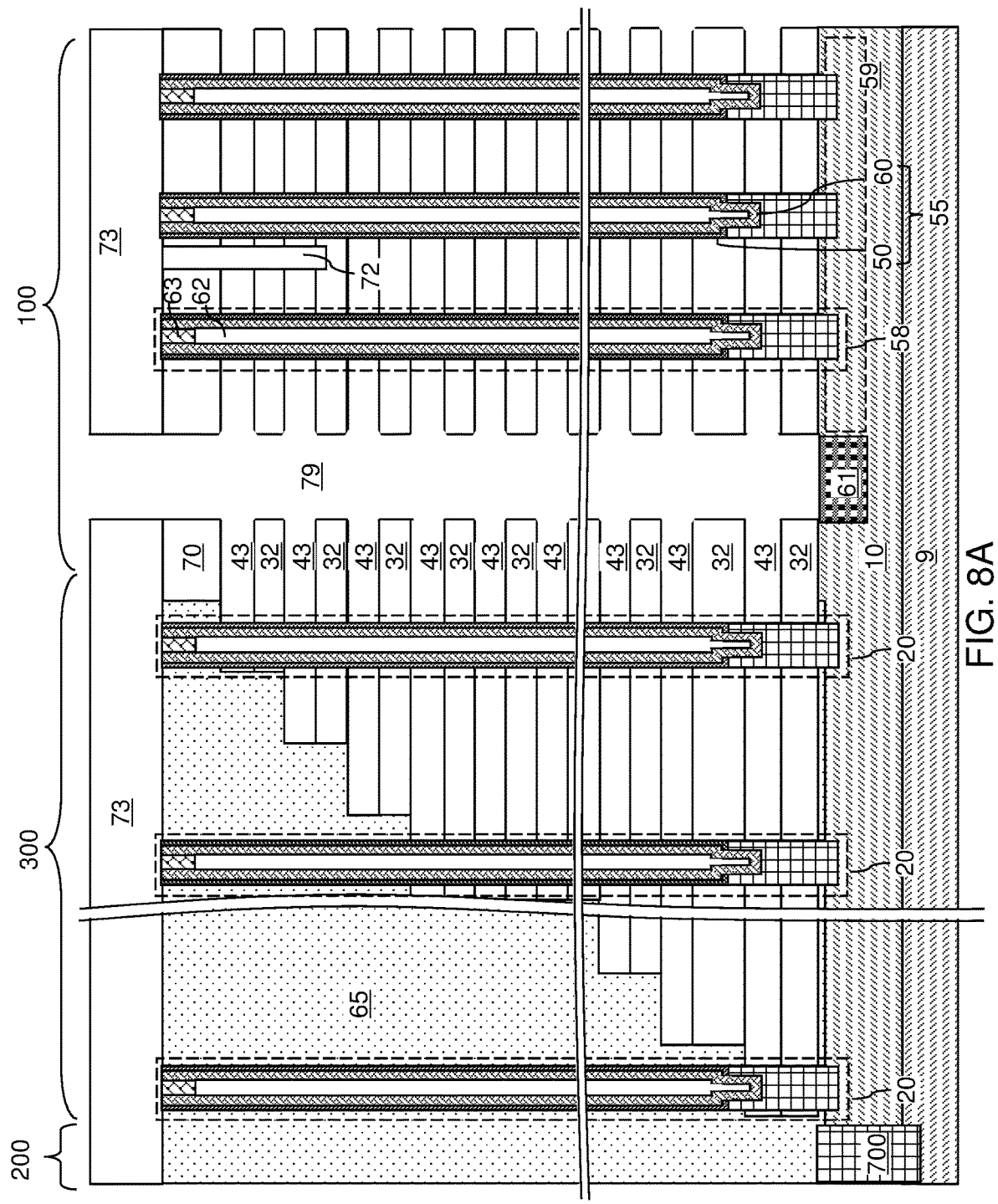
FIG. 8A is a schematic vertical cross-sectional view of the exemplary structure after formation of backside recesses according to an embodiment of the present disclosure.
Figure 8B:
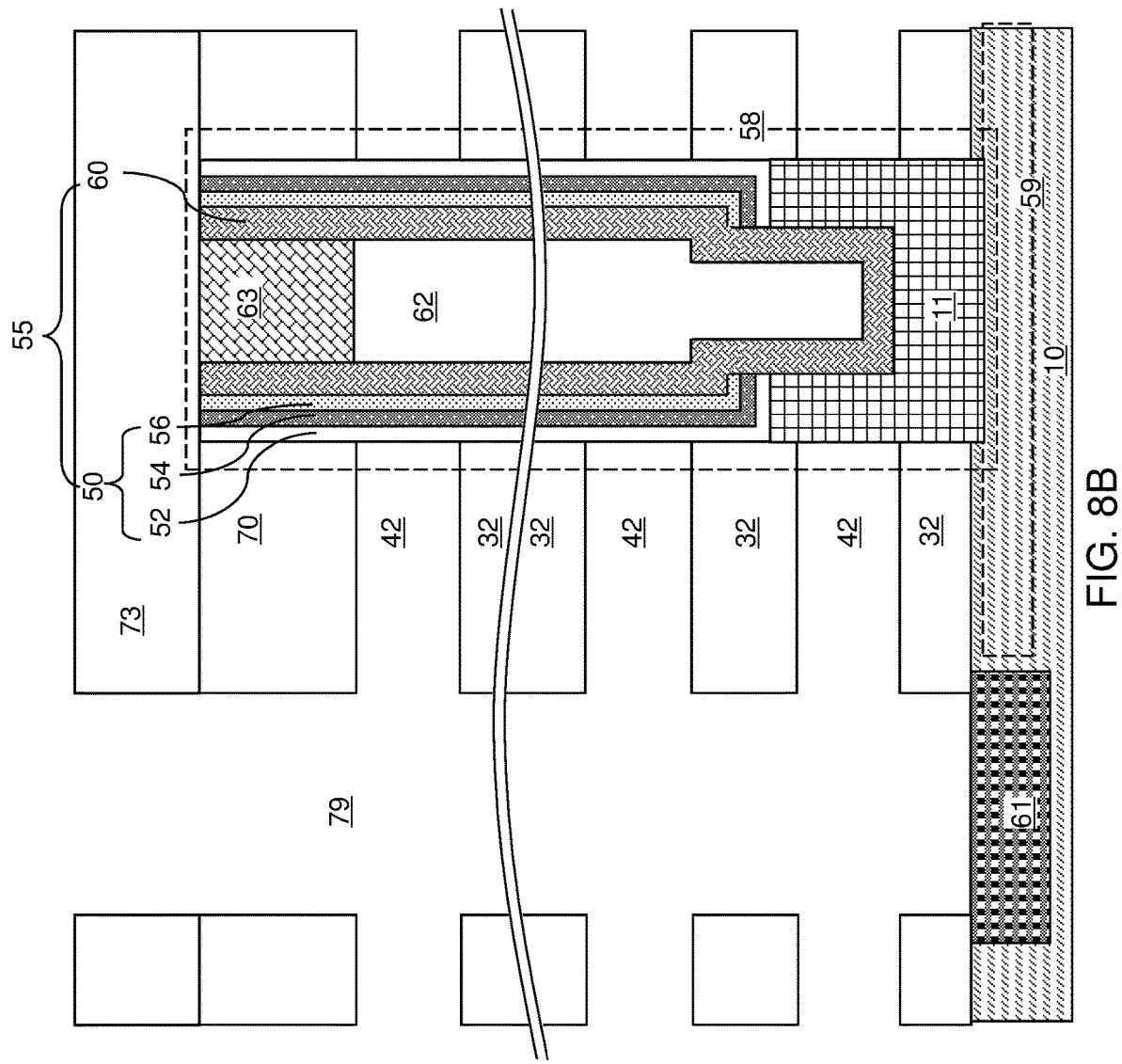
FIG. 8B is a magnified view of a region of the exemplary structure of FIG. 8A.

Referring to FIGS. 8A and 8B, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Figure 9:
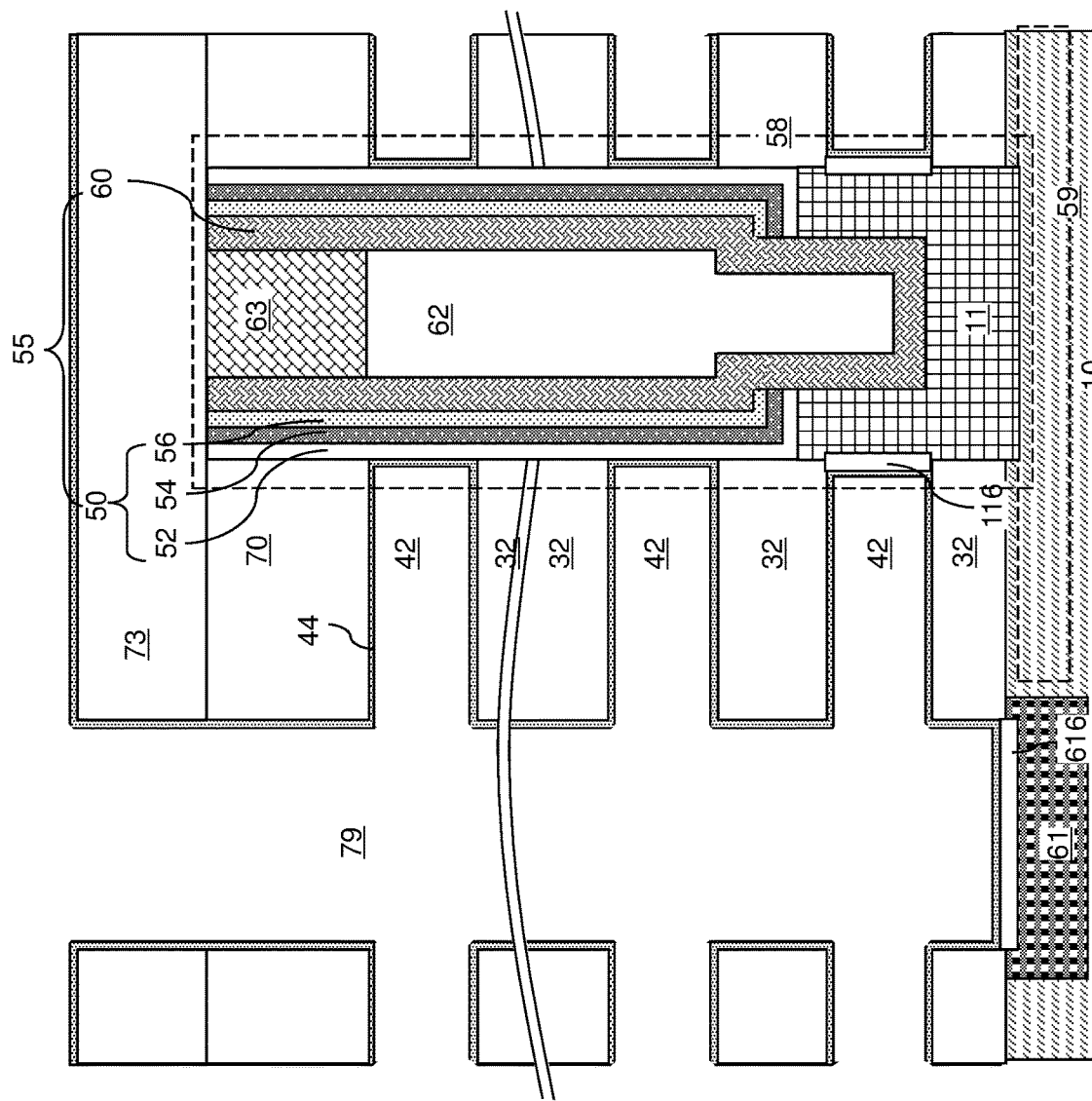
FIG. 9 is a schematic vertical cross-sectional view of a region of the exemplary structure after formation of tubular dielectric spacers and a backside blocking dielectric layer according to an embodiment of the present disclosure.

Referring to FIG. 9, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

A backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10:
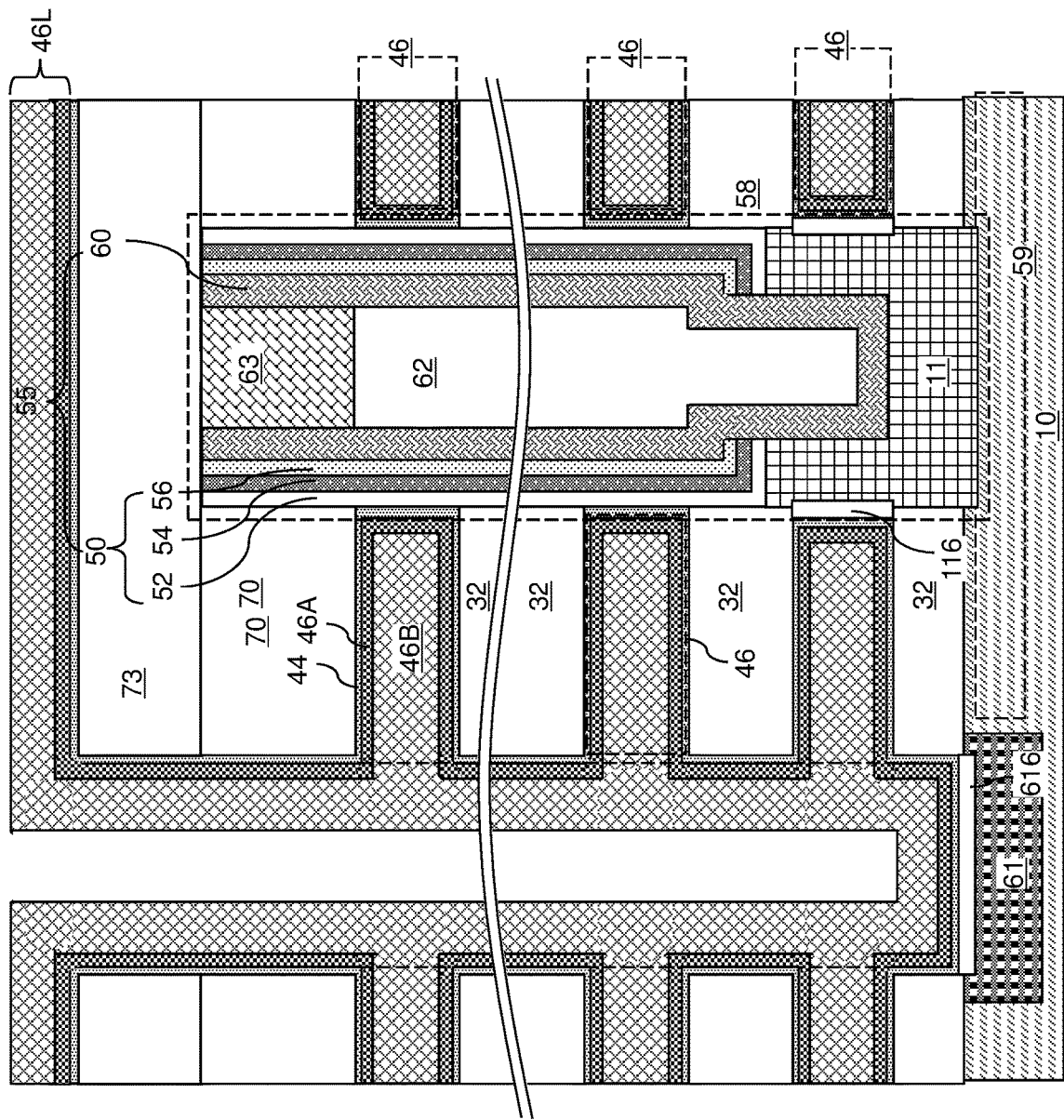
FIG. 10 is a schematic vertical cross-sectional view of a region of the exemplary structure after deposition of at least one electrically conductive material according to an embodiment of the present disclosure.

Referring to FIG. 10, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
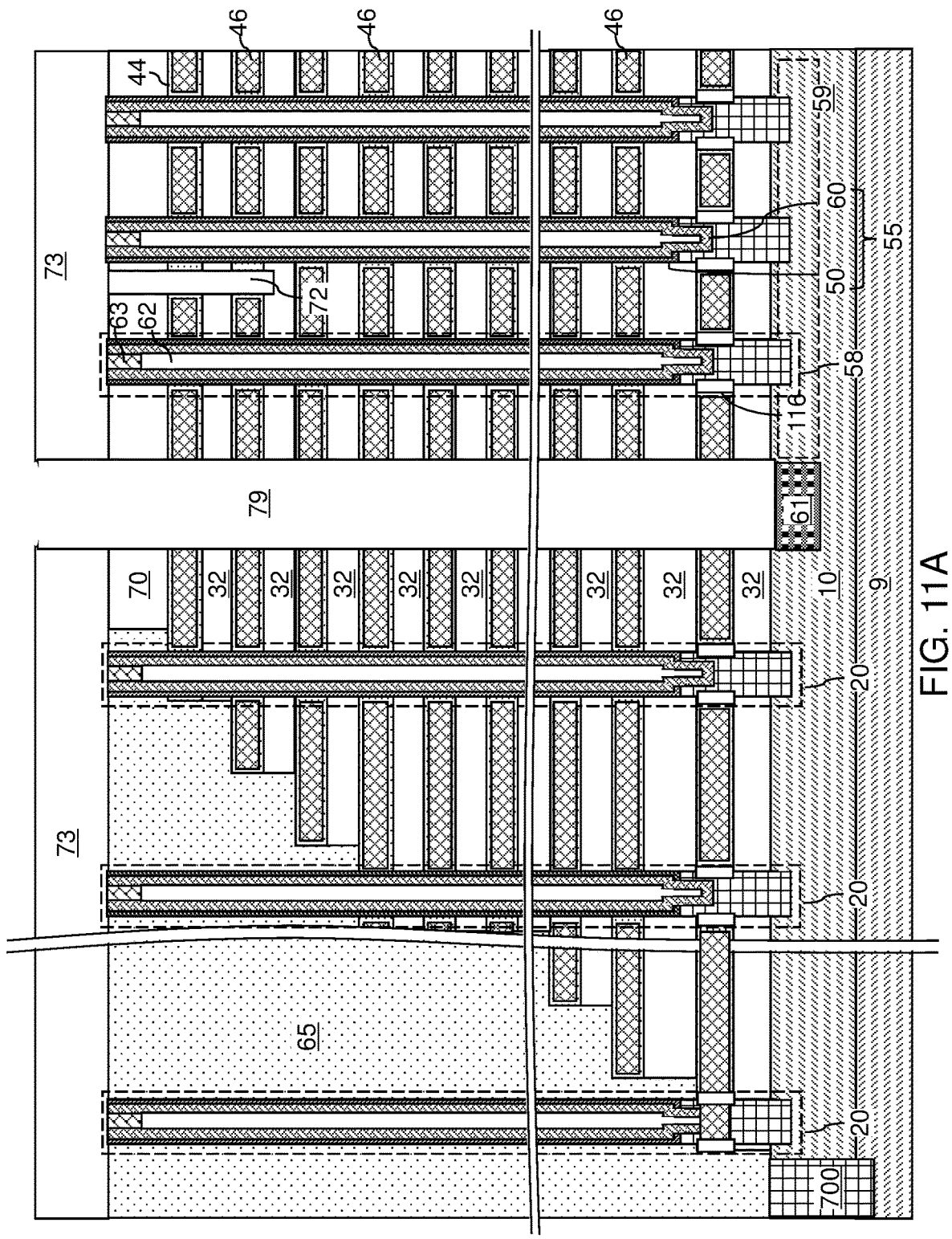
FIG. 11A is a schematic vertical cross-sectional view of the exemplary structure after removal of the at least one electrically conductive material from inside the backside trenches and from above a contact-level dielectric layer according to an embodiment of the present disclosure.
Figure 11B:
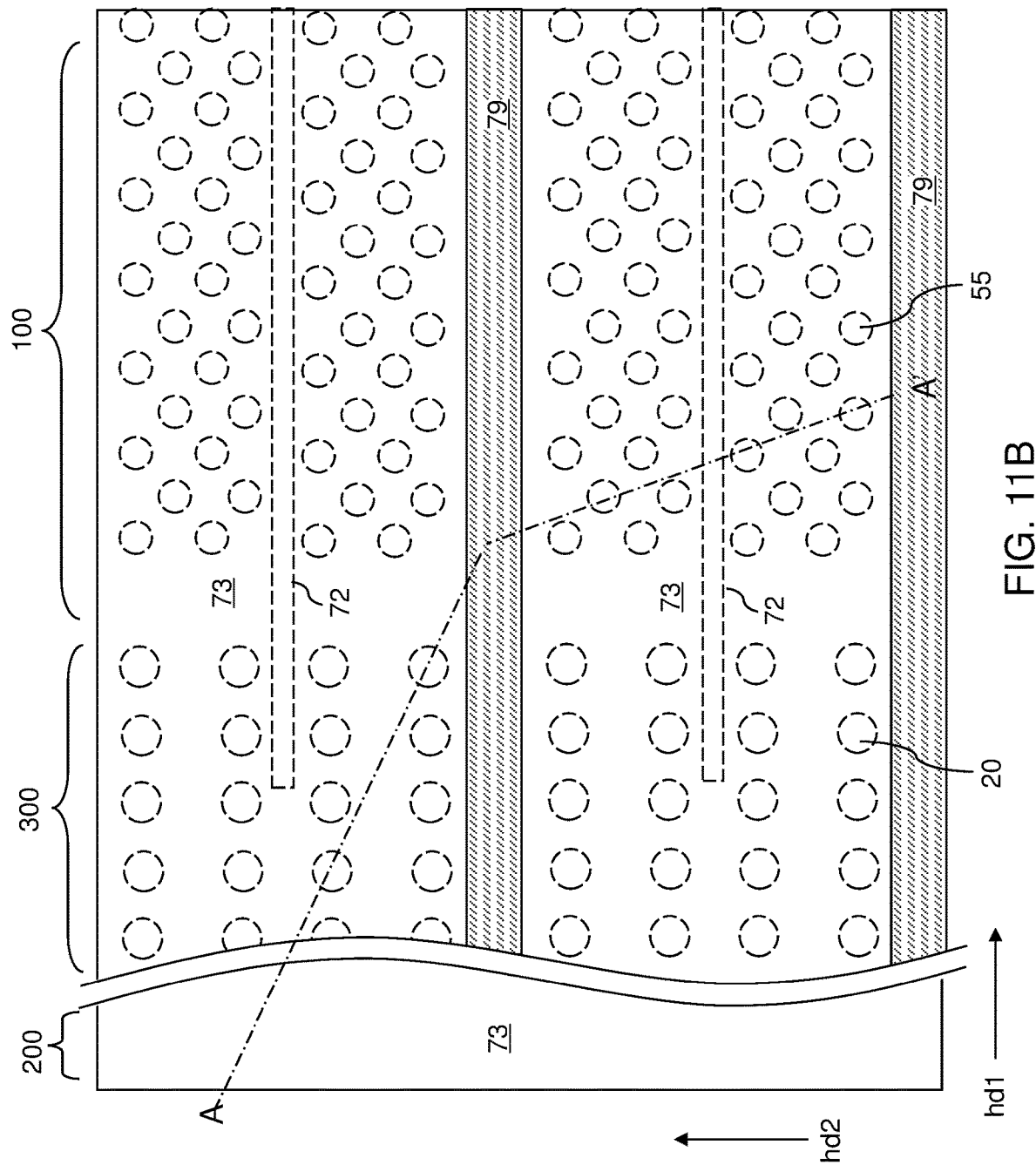
FIG. 11B is a partial see-through top-down view of the exemplary structure of FIG. 11A. The vertical plane A-A' is the plane of the schematic vertical cross-sectional view of FIG. 11A.
Figure 11C:
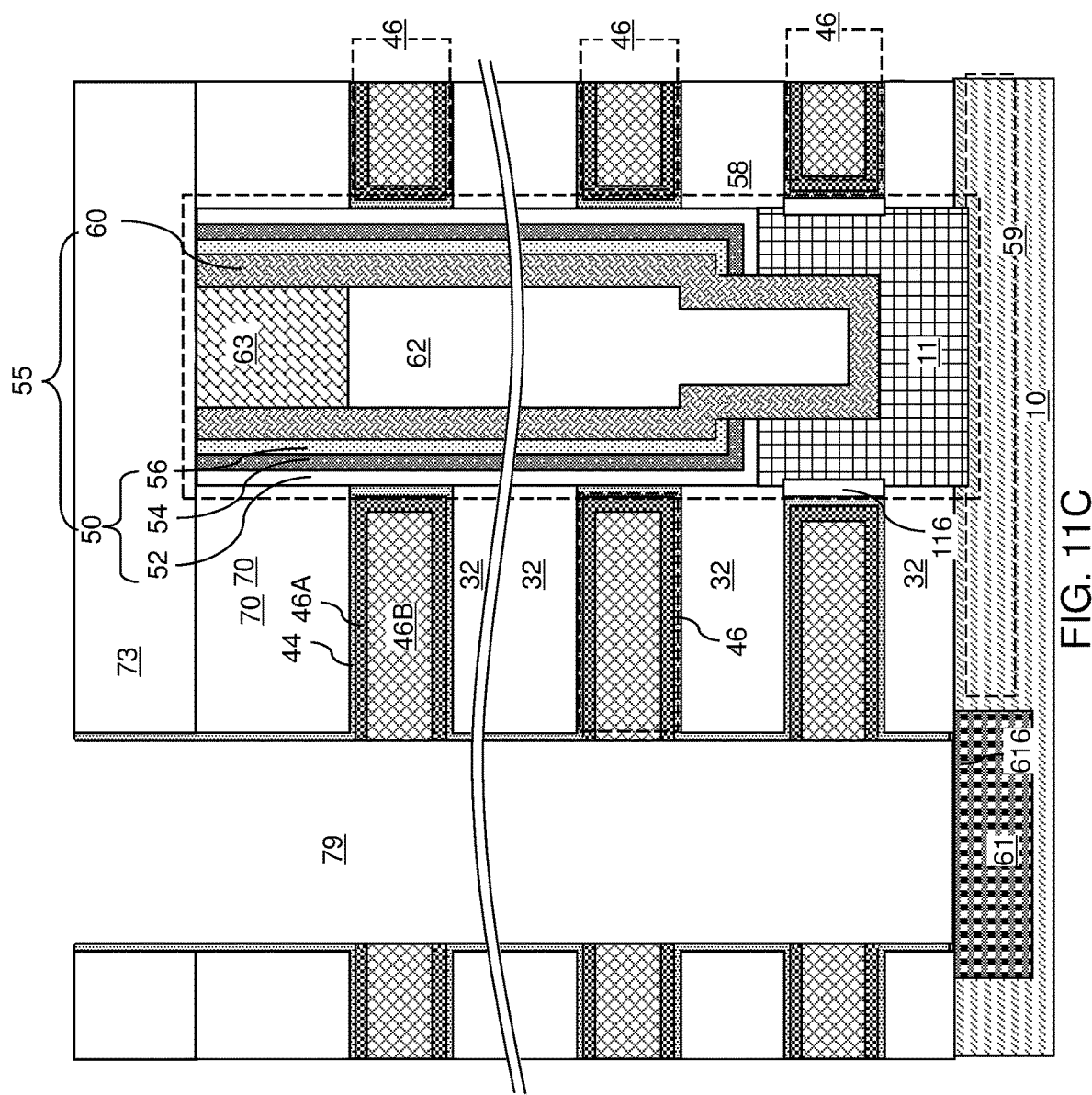
FIG. 11C is a magnified view of a region of the exemplary structure of FIG. 11A.

Referring to FIGS. 11A-11C, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. Each backside cavity 79' continuous extends along the first horizontal direction hd1.

Figure 12:
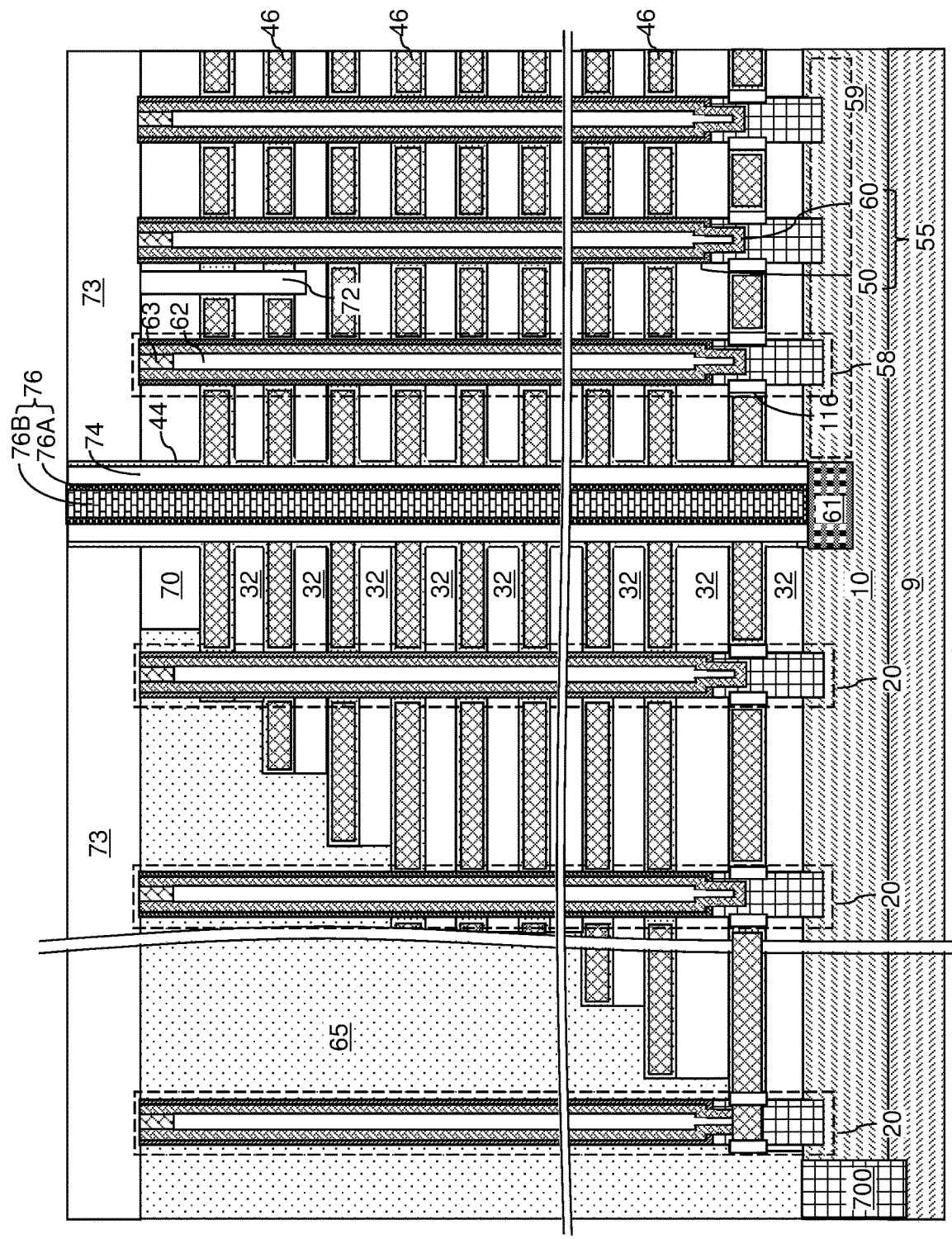
FIG. 12 is a schematic vertical cross-sectional view of the exemplary structure after formation of an insulating spacer and a backside contact structure according to an embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 13A:
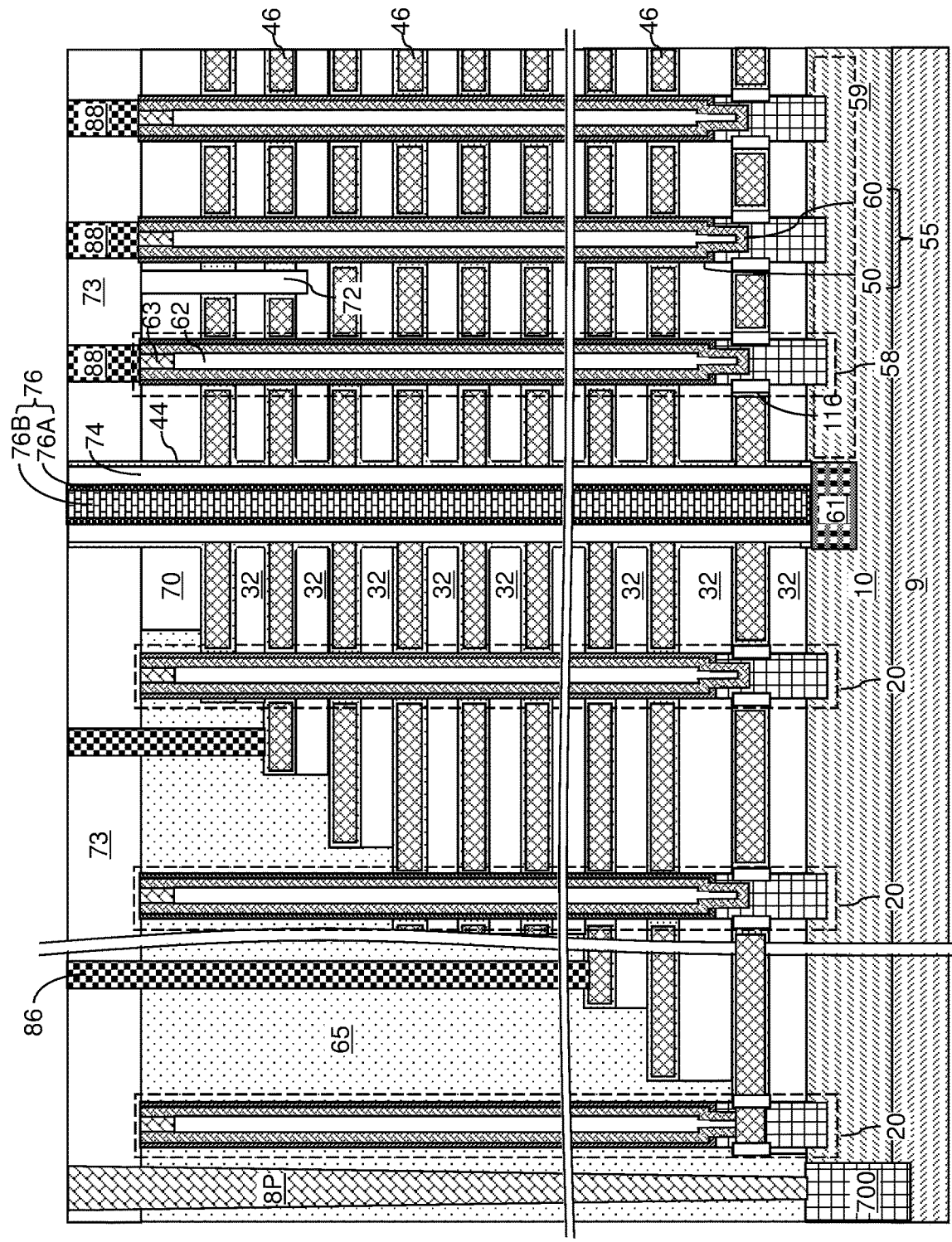
FIG. 13A is a schematic vertical cross-sectional view of the exemplary structure after formation of additional contact via structures according to an embodiment of the present disclosure.
Figure 13B:
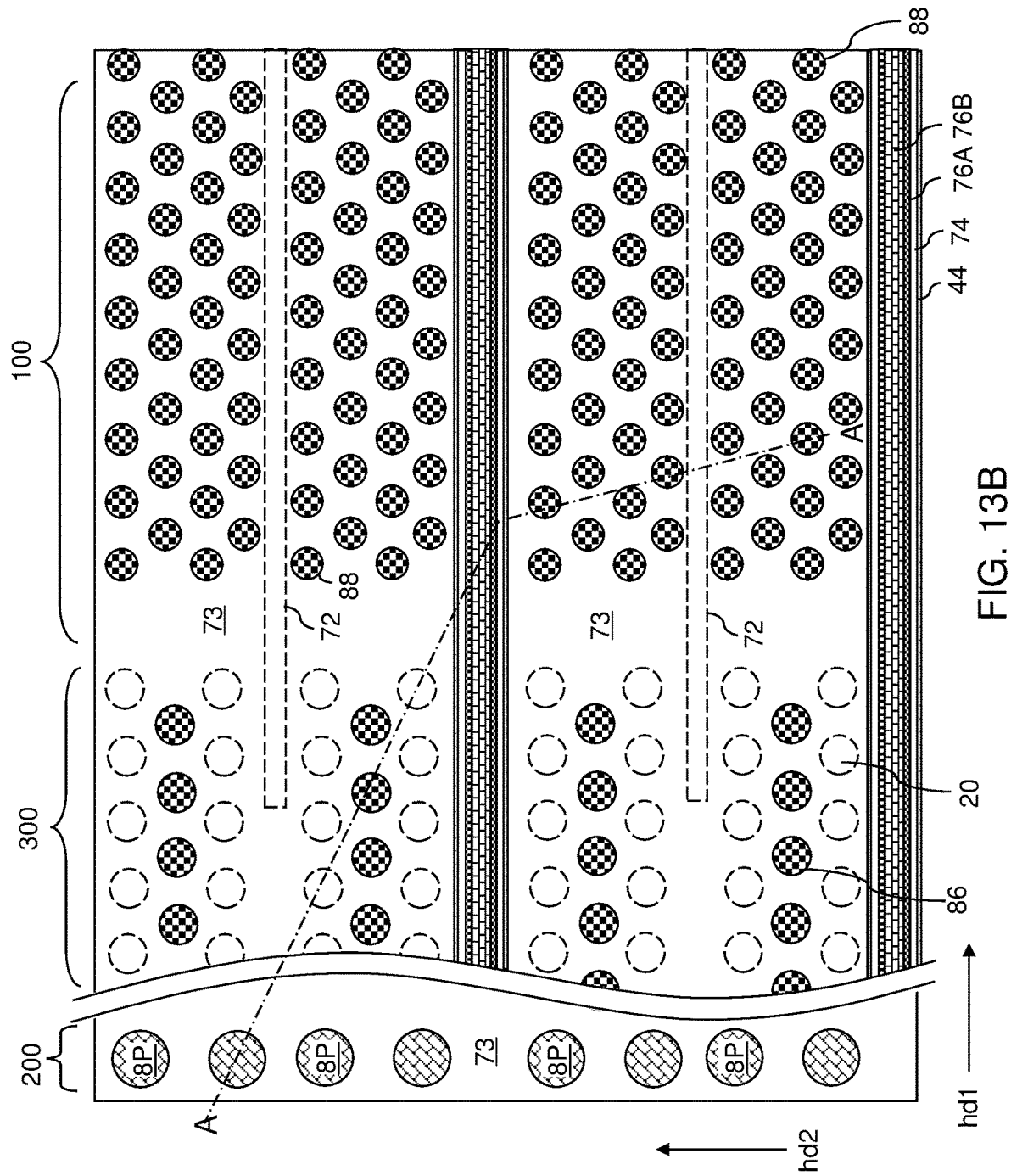
FIG. 13B is a top-down view of the exemplary structure of FIG. 13A. The vertical plane A-A' is the plane of the schematic vertical cross-sectional view of FIG. 13A.
Figure 13C:
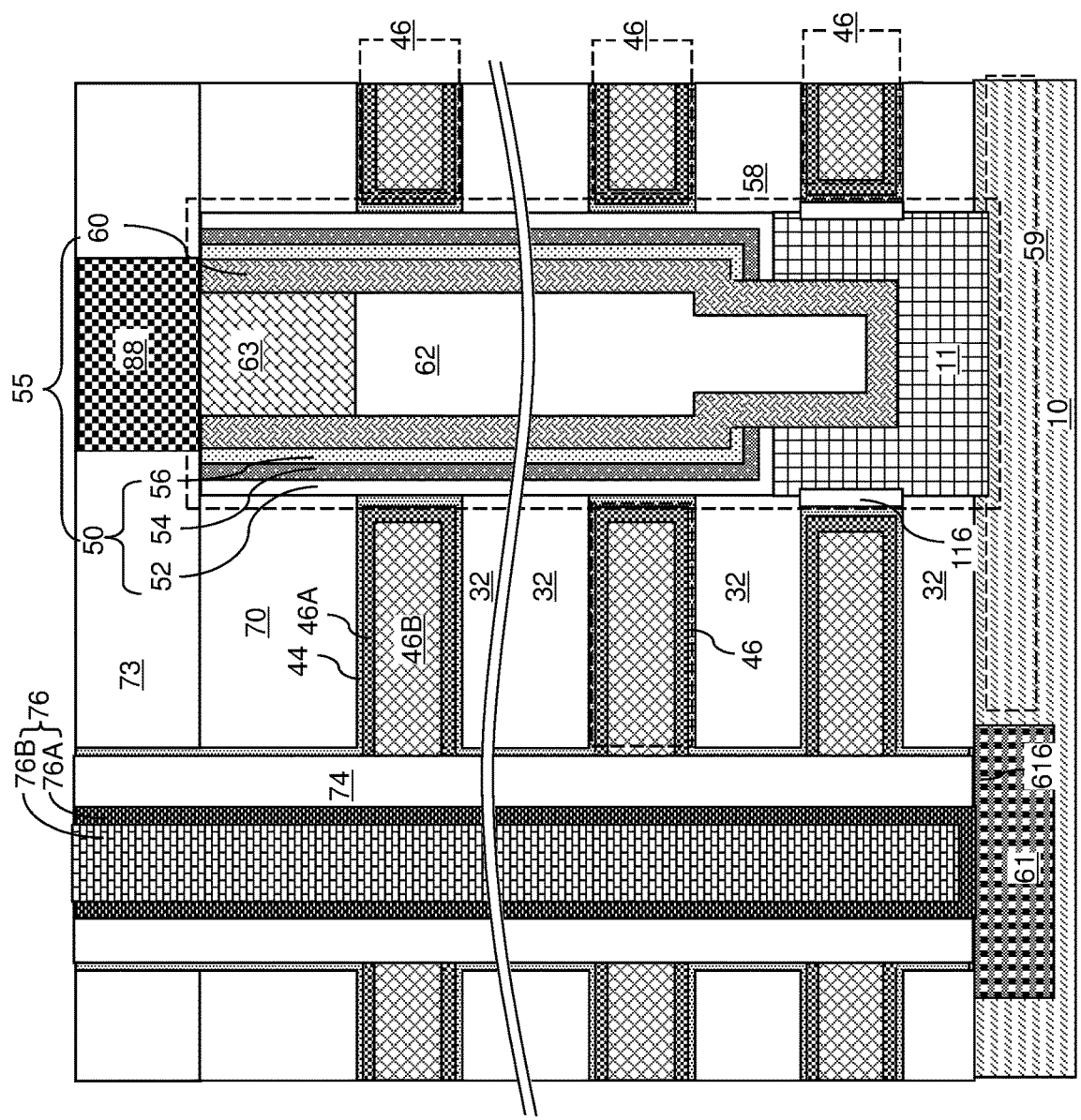
FIG. 13C is a magnified view of a region of the exemplary structure of FIG. 13A.
Figure 14A:
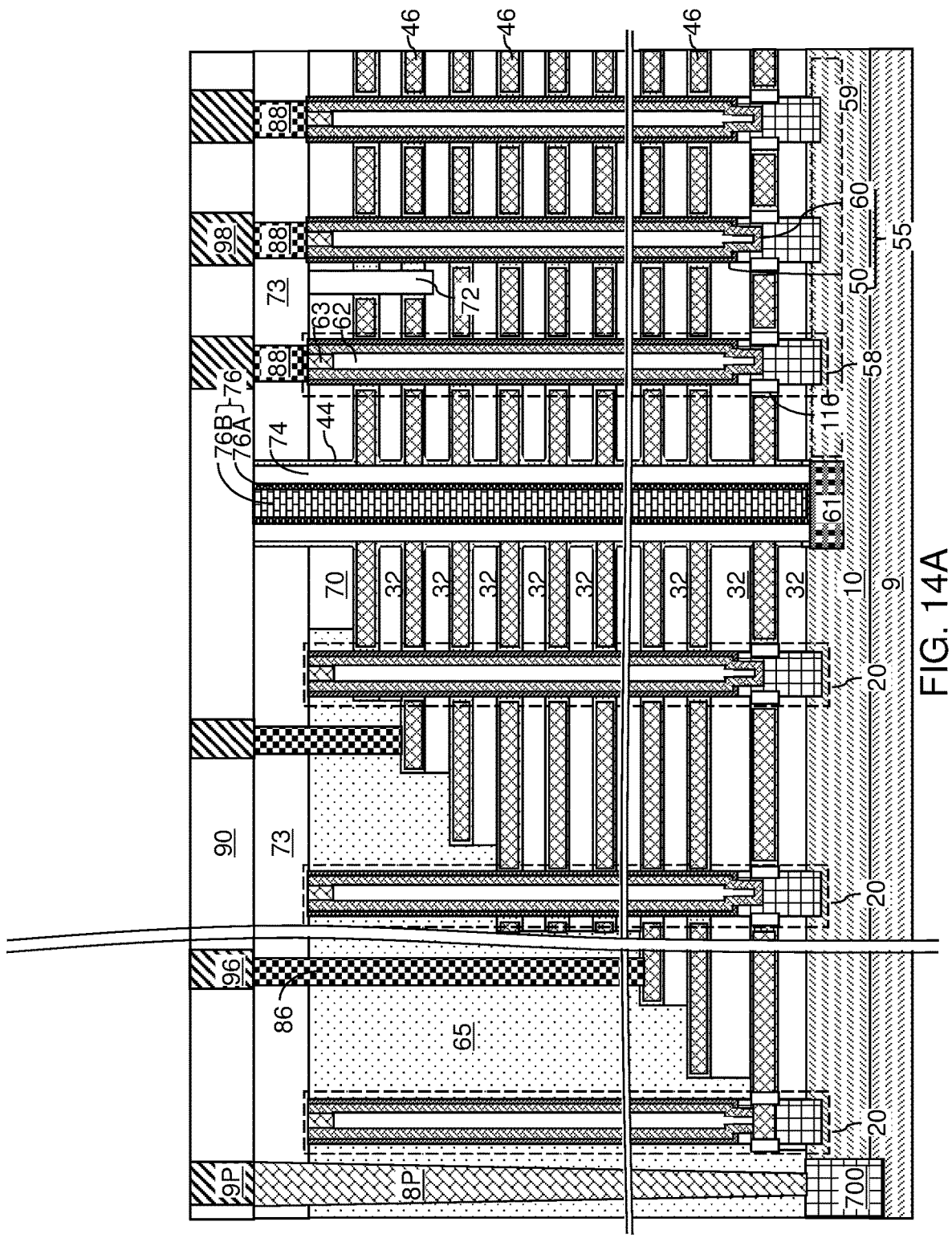
FIG. 14A is schematic vertical cross-sectional view of the exemplary structure after formation of a connection-level dielectric layer and connection-level via structures according to an embodiment of the present disclosure.
Figure 14B:
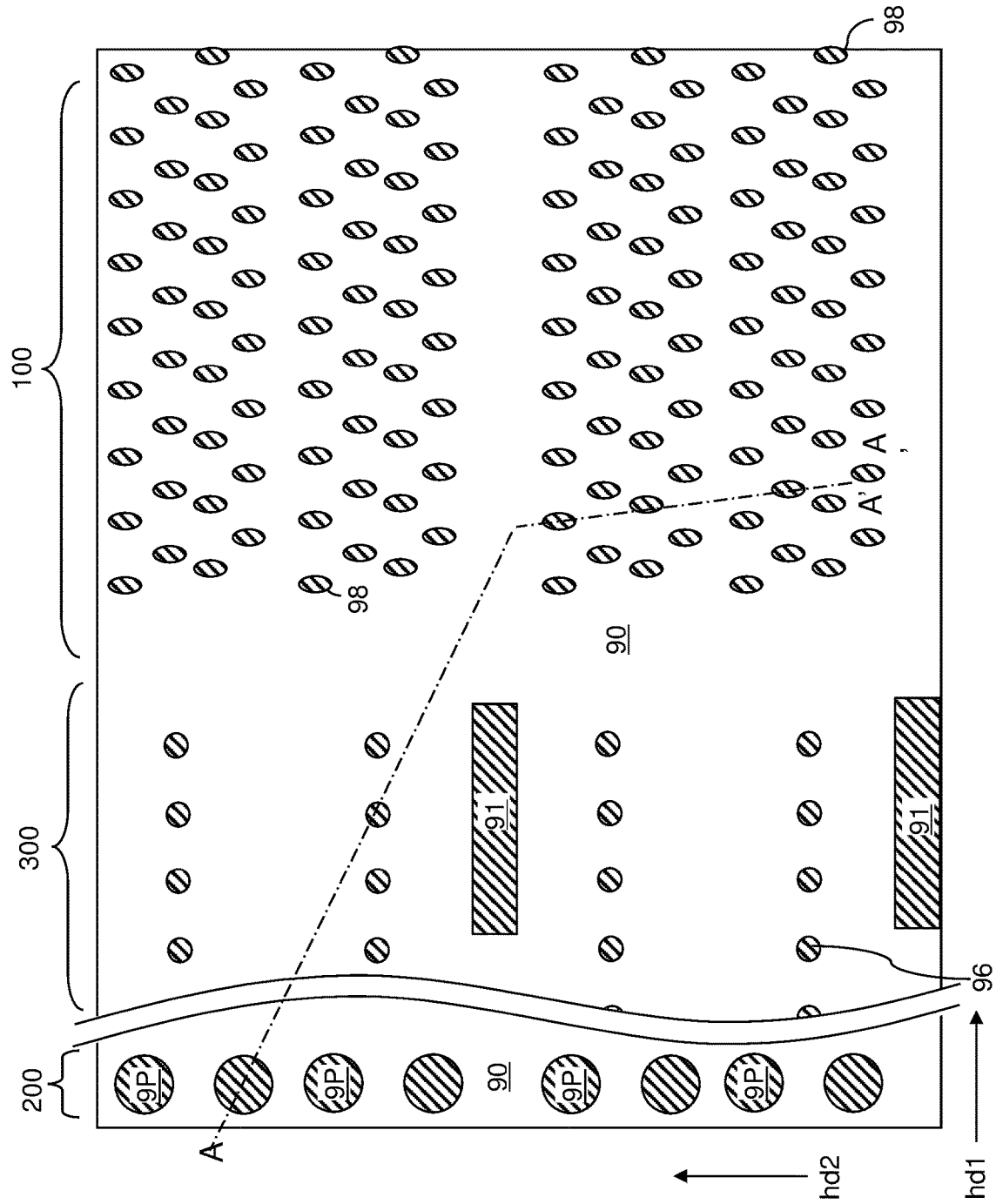
FIG. 14B is a top-down view of the exemplary structure of FIG. 14A. The vertical plane A-A' is the plane of the schematic vertical cross-sectional view of FIG. 14A.

Referring to FIGS. 13A-13C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

In one embodiment, semiconductor devices formed over the substrate (9, 10) may comprise a three-dimensional memory array. The three-dimensional memory array may include an alternating stack of insulating layers 32 and electrically conductive layers 46 located over a substrate (9, 10); a two-dimensional array of memory openings 49 vertically extending through the alternating stack (32, 46); and a two-dimensional array of memory opening fill structures 58 located within the two-dimensional array of memory openings 49 and including a respective vertical semiconductor channel 60 and a respective vertical stack of memory elements (such as portions of the memory material layers 54 located at levels of the electrically conductive layers 46). The doped semiconductor material regions (such as the drain regions 63) are adjoined to a top end of a respective one of the vertical semiconductor channels 60. While the semiconductor device of the embodiment comprises a three-dimensional memory array, embodiments of the present disclosure can be practiced on any semiconductor structure including any suitable semiconductor device containing bit lines.

Referring to FIGS. 14A-14D, a connection-level dielectric layer 90 can be formed over the contact-level dielectric layer 73, or any underlying layer embedding contact via structures such as drain contact via structures 88 that contact the drain regions 63 (which are doped semiconductor regions). The connection-level dielectric layer 90 is a connection-level material layer comprised of at least one dielectric material. The connection-level dielectric layer 90 may include an interconnect-level dielectric material such as undoped silicate glass, a doped silicate glass, or organosilicate glass, or may include a sacrificial material (such as a semiconductor material or a carbon-based material) that is subsequently removed. The thickness of the connection-level dielectric layer 90 can be in a range from 100 nm to 1,000 nm, such as from 200 nm to 500 nm, although lesser and greater thicknesses may also be employed.

Connection via cavities can be formed through the connection-level dielectric layer 90 by depositing and lithographically patterning a photoresist layer over the connection-level dielectric layer 90, and transferring the pattern of openings in the photoresist layer through the connection-level dielectric layer 90 employing an anisotropic etch process. The photoresist layer can be subsequently removed, for example, by ashing.

At least one electrically conductive material can be deposited in the connection via cavities, and excess portions of the at least one electrically conductive material can be removed from above the horizontal plane including the top surface of the connection-level dielectric layer 90 by a planarization process, which may include a chemical mechanical planarization process and/or a recess etch process. Each remaining portion of the at least one electrically conductive material located within a respective one of the connection via cavities comprise connection-level via structures (98, 96, 9P). The connection-level via structures (98, 96, 9P) can comprise drain-side connection-level via structures 98 contacting a top surface of a respective one of the drain contact via structures 88, word-line-side connection-level via structures 96 contacting a top surface of a respective one of the word line contact via structures 86, source-side connection via structures 91 (shown in FIG. 14B) contacting the backside contact via structures 76, and peripheral-region connection via structures 9P contacting a top surface of a respective one of the peripheral device contact via structures 8P.

Generally, a combination of a connection-level material layer (such as the connection-level dielectric layer 90) and a two-dimensional array of connection via structures (such as the drain-side connection-level via structures 98) embedded in the connection-level material layer can be formed over the semiconductor device array. Each of the connection via structures within the two-dimensional array of connection via structures (such as the drain-side connection-level via structures 98) overlies, and is electrically connected to, a respective one of the doped semiconductor material regions (such as the drain regions 63). In one embodiment, the drain-side connection-level via structures 98 can be laterally elongated along a horizontal direction that is perpendicular to the lengthwise direction of the backside trenches 79. For example, the drain-side connection-level via structures 98 can be laterally elongated along the second horizontal direction (i.e., bit line direction) hd2, which is the lengthwise direction of bit lines to be subsequently formed.

Figure 15A:
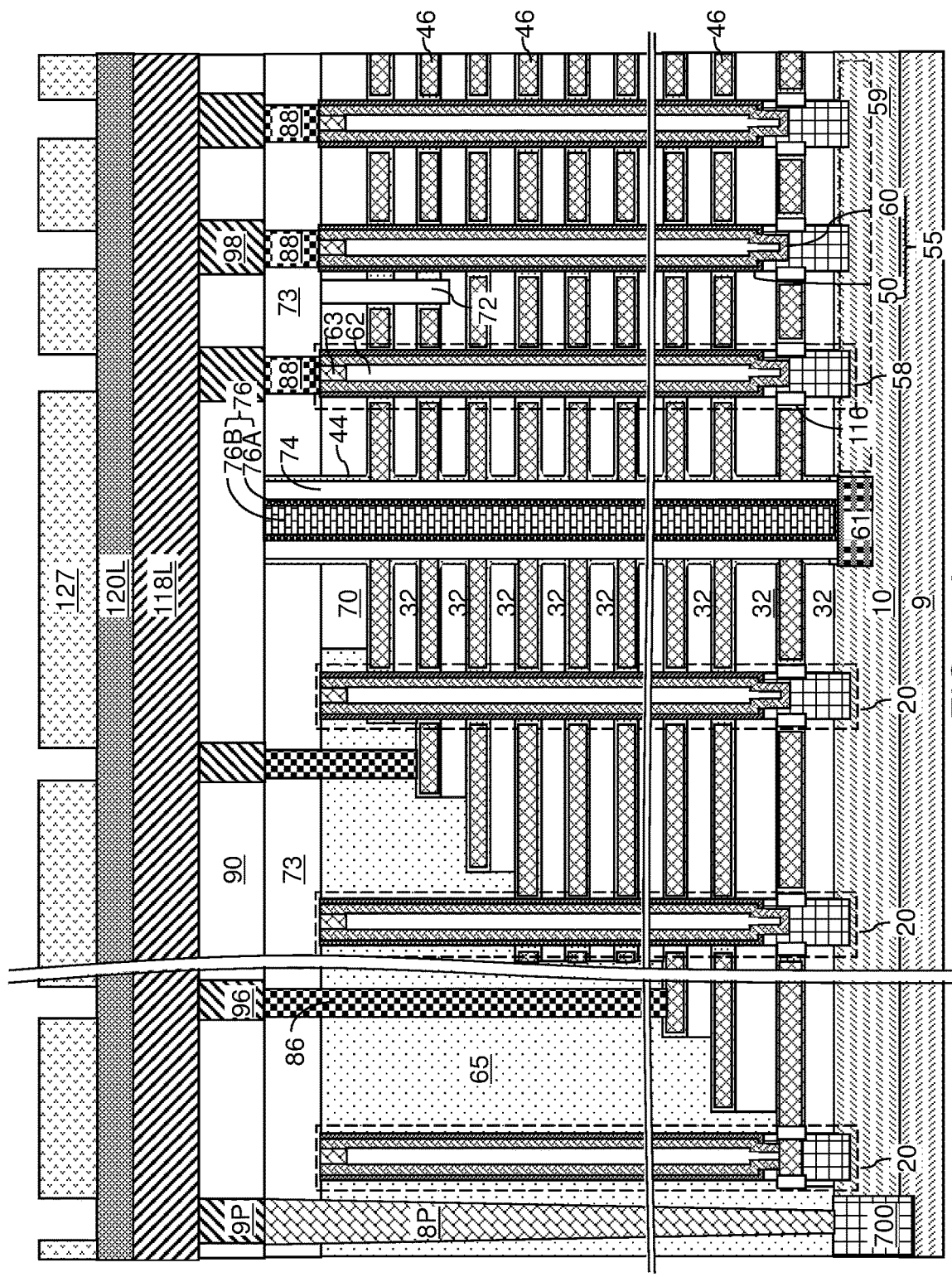
FIG. 15A is schematic vertical cross-sectional view of the exemplary structure after formation of an electrically conductive material layer, a dielectric capping material layer, and a patterned photoresist layer according to an embodiment of the present disclosure.
Figure 15B:
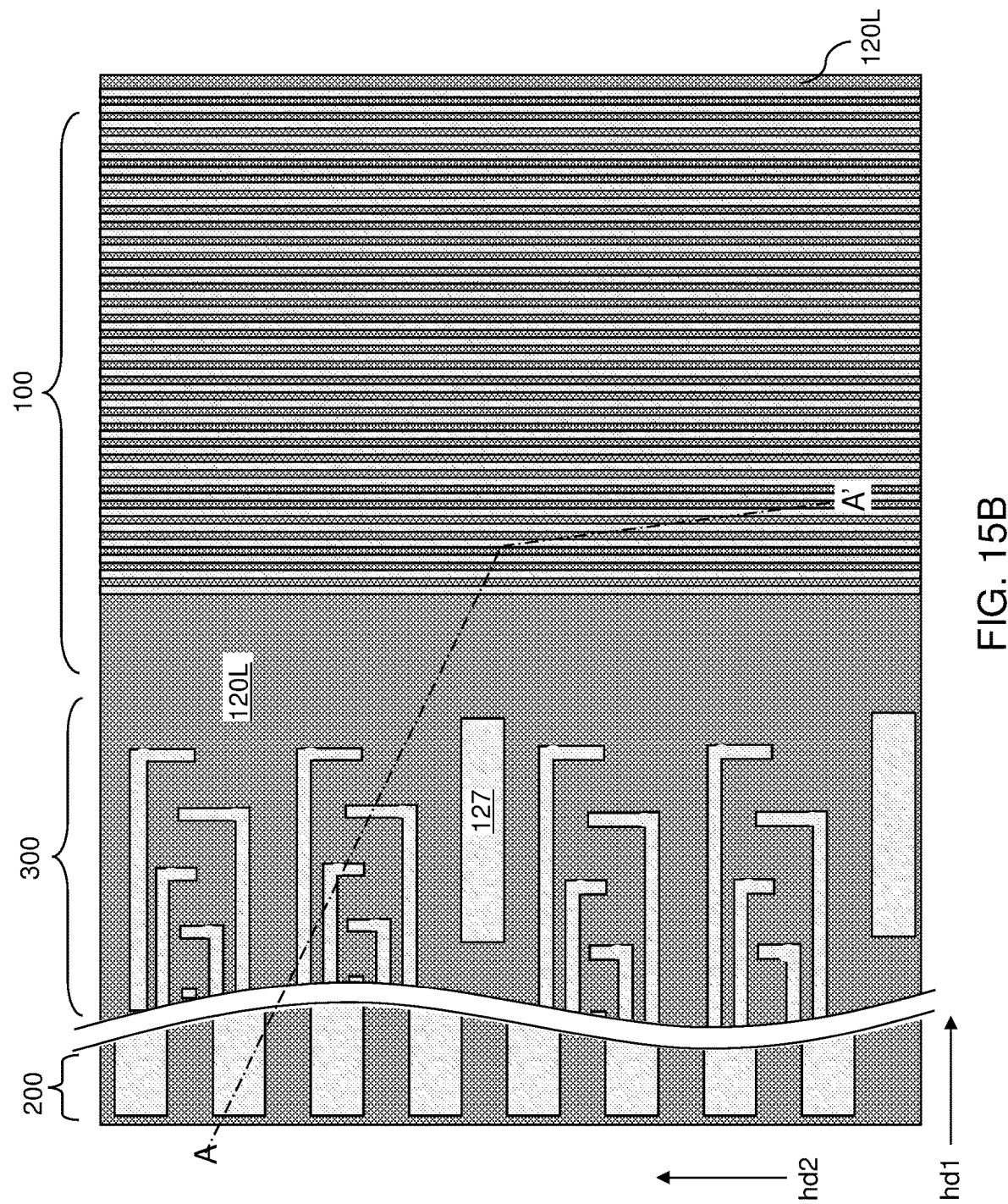
FIG. 15B is a top-down view of the exemplary structure of FIG. 15A. The vertical plane A-A' is the plane of the schematic vertical cross-sectional view of FIG. 15A.
Figure 15D:
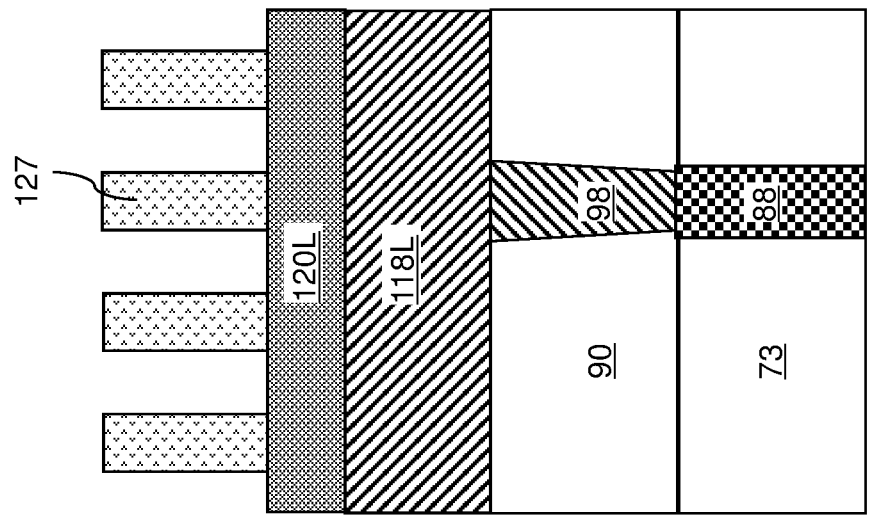
FIG. 15D is a vertical cross-sectional view of the exemplary structure along the vertical plane D-D' of FIG. 15C.
Figure 15C:
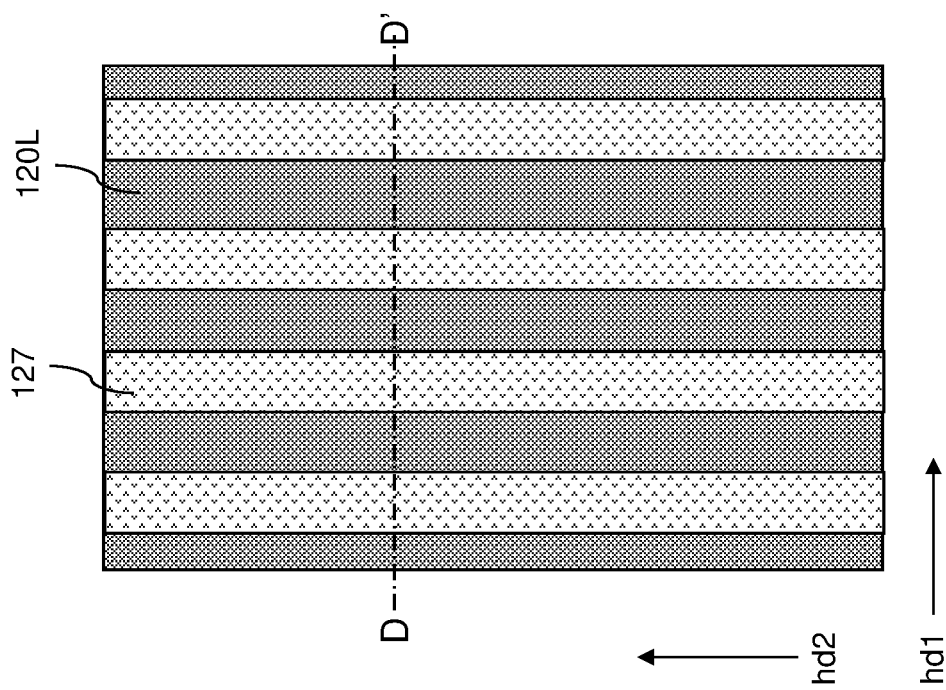
FIG. 15C is a top-down view of a region of the exemplary structure of FIG. 15A.

Referring to FIG. 15A, an electrically conductive material layer 118L can be deposited over the connection-level dielectric layer 90. The electrically conductive material layer 118L includes, and/or consists essentially of, a high-conductivity metallic material such as tungsten, copper, molybdenum, cobalt, ruthenium, and combinations or alloys thereof. The electrically conductive material layer 118L may consist essentially of a single elemental metal or an intermetallic alloy. The electrically conductive material layer 118L can be deposited by physical vapor deposition, chemical vapor deposition, electroplating, electroless plating, or combinations thereof. The thickness of the electrically conductive material layer 118L may be in a range from 50 nm to 500 nm, such as from 100 nm to 250 nm, although lesser and greater thicknesses may also be employed. The metallic material of the electrically conductive material layer 118L may be deposited directly on the top surfaces of the connection-level via structures (98, 96, 9P) without use of any metallic barrier layer (such as a TiN layer, a TaN layer, or a WN layer). Alternatively, a metallic barrier layer (such as a TiN layer, a TaN layer, or a WN layer; not expressly shown) may be formed on the top surfaces of the connection-level via structures (98, 96, 9P) followed by deposition of an elemental metal layer (e.g., such as a tungsten layer) on the metallic barrier layer.

A dielectric capping material layer (e.g., hard mask layer) 120L can be deposited over the electrically conductive material layer 118L. The dielectric capping material layer 120L includes a dielectric material such as silicon nitride, silicon carbide nitride, silicon oxynitride, or a dielectric metal oxide (such as aluminum oxide, lanthanum oxide, yttrium oxide, hafnium oxide, tantalum oxide, etc.), and may be deposited by a conformal or a non-conformal deposition process. The thickness of the dielectric capping material layer 120L may be in a range from 25 nm to 250 nm, such as from 50 nm to 125 nm, although lesser and greater thicknesses may also be employed.

A patterned photoresist layer 127 can be formed over the dielectric capping material layer 120L. The patterned photoresist layer 127 can be formed by applying a blanket (unpatterned) photoresist layer over the dielectric capping material layer 120L, and patterning the blanket photoresist layer by lithographic patterning and development of the blanket photoresist layer. A portion of the pattern in the patterned photoresist layer 127 in the memory array region 100 can include a periodic line-and-space pattern with lines laterally extending along the second horizontal direction hd1. The pattern in the patterned photoresist layer 127 may include various additional line patterns that are formed in the contact region 300 and in the peripheral device region 200.

FIGS. 16A-16H are sequential vertical cross-sectional views of a region of a first configuration of the exemplary structure during formation of bit-line-level structures according to a first embodiment of the present disclosure.

Figure 16A:
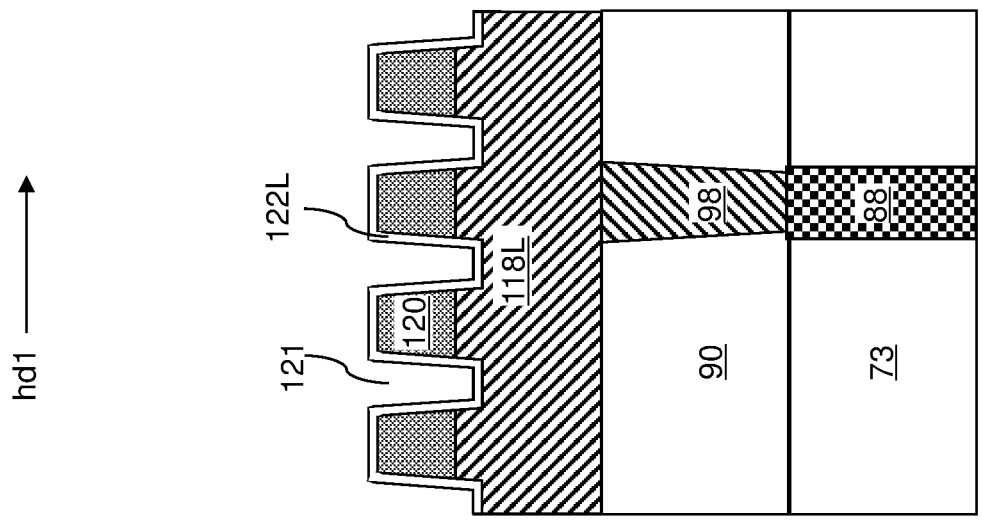
FIGS. 16A-16H are sequential vertical cross-sectional views of a region of a first configuration of the exemplary structure during formation of bit-line-level structures according to a first embodiment of the present disclosure.

Referring to FIG. 16A, an anisotropic etch process can be performed to transfer the pattern in the photoresist layer through the dielectric capping material layer 120L. Remaining portions of the dielectric capping material layer 120L in the memory array region 100 comprise dielectric rails (e.g., hard mask rails). In one embodiment the dielectric rails may have a uniform vertical cross-sectional shape that is invariant under translation along the second horizontal direction hd2. As used herein, a "rail" refers to a structure that laterally extends along a lengthwise direction and may have a uniform vertical cross-sectional shape that is invariant under translation along the lengthwise direction. The dielectric rails that are patterned portions of the dielectric capping material layer 120L are herein referred to bit-line-capping dielectric rails 120. In one embodiment, each of the bit-line-capping dielectric rails 120 may comprise a pair of lengthwise sidewalls, a planar top surface, and a planar bottom surface. In one embodiment, each of the bit-line-capping dielectric rails 120 may comprise a respective trapezoidal vertical cross-sectional shape with tapered lengthwise sidewalls in vertical planes that are parallel to the widthwise direction, such as the first horizontal direction hd1.

In one embodiment, the pattern in the patterned photoresist layer 127 also may be transferred into an upper portion of the electrically conductive material layer 118L. In this case, the recess depth of the recessed horizontal surface segments of the electrically conductive material layer 118L may be in a range from 0.1% to 50%, such as from 1% to 15%, of the height of the electrically conductive material layer 118L. Trenches 121 are formed between the sidewalls of the bit-line-capping dielectric rails 120 and the etched upper portion of the electrically conductive material layer 118L.

In one embodiment, the bit-line-capping dielectric rails 120 may be formed as a one-dimensional periodic array of bit-line-capping dielectric rails 120. In one embodiment, the pitch of the one-dimensional periodic array of bit-line-capping dielectric rails 120 along the first horizontal direction hd1 may be in a range from 10 nm to 400 nm, such as from 20 nm to 200 nm, although lesser and greater thicknesses may also be employed. Generally, the bit-line-capping dielectric rails 120 can be formed over the electrically conductive material layer 118L. The bit-line-capping dielectric rails 120 laterally extend along a lengthwise direction (such as the second horizontal direction (e.g., bit line direction) hd2) and are laterally spaced apart along a widthwise direction (such as the first horizontal direction (e.g., word line direction) hd1). The patterned photoresist layer 127 may be subsequently removed, for example, by ashing.

Figure 16B:
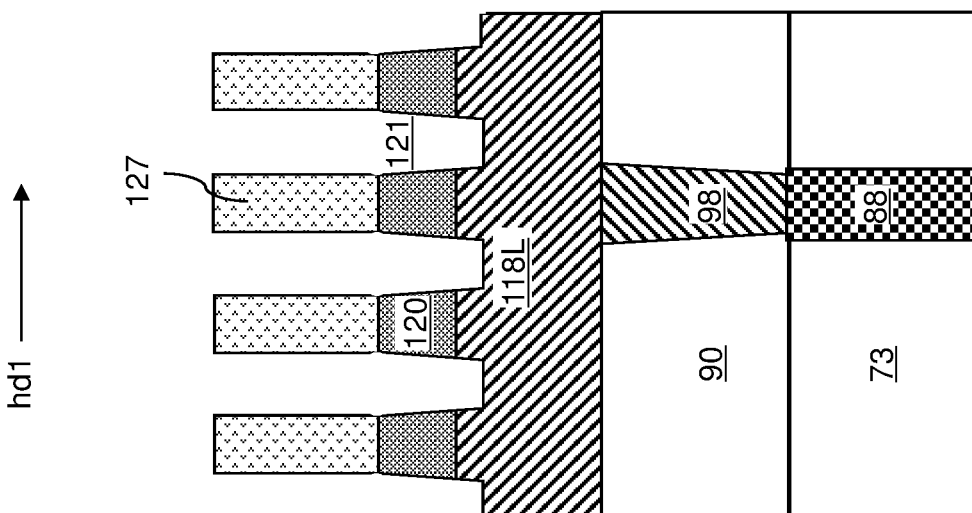

Referring to FIG. 16B, an etch mask material layer 122L can be formed over the bit-line-capping dielectric rails 120 and the electrically conductive material layer 118L by a conformal deposition process or a non-conformal deposition process. The etch mask material layer 122L comprises a different material than the materials of the bit-line-capping dielectric rails 120 and the electrically conductive material layer 118L. For example, the etch mask material layer 122L can include a dielectric metal oxide material (such as aluminum oxide) or silicon oxide. The etch mask material layer 122L can have a thickness in a range from 0.1% to 15%, such as from 0.5% to 10%, of the pitch of the one-dimensional array of bit-line-capping dielectric rails 120. The etch mask material layer 122L contacts the sidewalls of the bit-line-capping dielectric rails 120 and the etched upper portion of the electrically conductive material layer 118L in the trenches 121 located between the sidewalls of the bit-line-capping dielectric rails 120 and the etched upper portion of the electrically conductive material layer 118L.

Figure 16C:
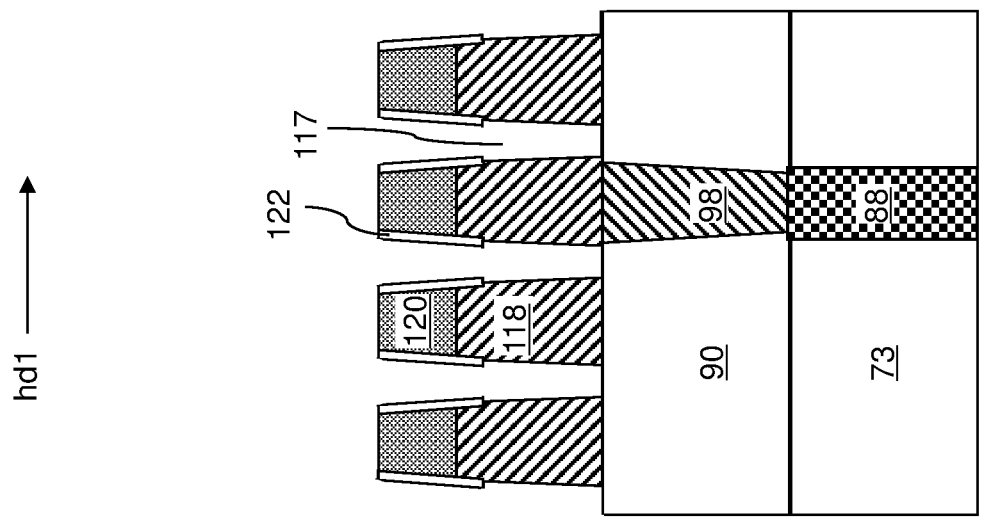

Referring to FIG. 16C, an anisotropic etch process can be performed to remove horizontally-extending portions of the etch mask material layer 122L. Remaining vertical portions of the etch mask material layer 122L comprise etch mask spacers 122 that remain on sidewalls of the bit-line-capping dielectric rails 120. In one embodiment, a pair of etch mask spacers 122 can be formed on each of the bit-line-capping dielectric rails 120. In one embodiment, a bottom segment of each of the etch mask spacers 122 may contact a respective upper sidewall segment of the electrically conductive material layer 118L.

Figure 16D:
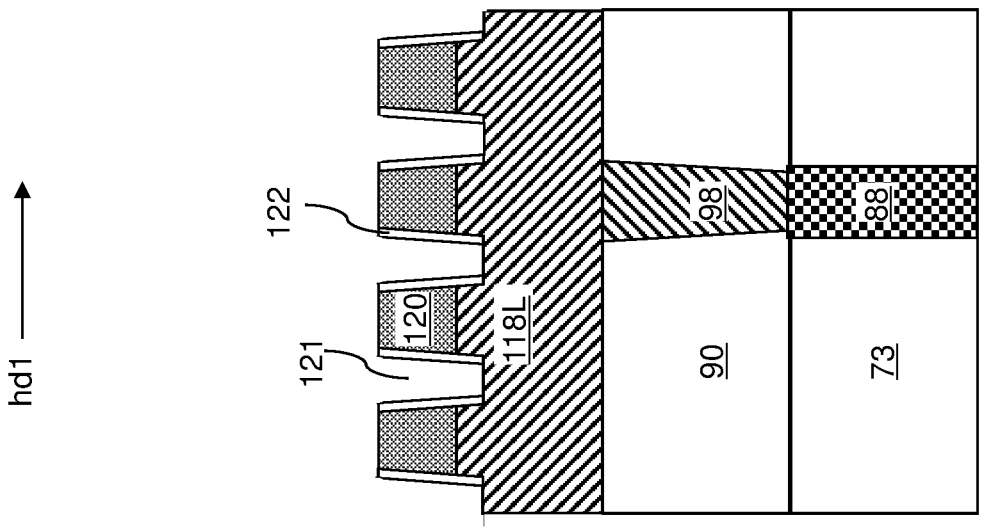

Referring to FIG. 16D, the electrically conductive material layer 118L can be patterned into bit lines 118 by performing an etch process that etches portions of the electrically conductive material layer 118L exposed in the trenches 121 that are not masked by the bit-line-capping dielectric rails 120 and the etch mask spacers 122. In one embodiment, the etch process may comprise at least one etch process that employed a combination of the bit-line-capping dielectric rails 120 and the etch mask spacers 122 as a composite etch mask. In one embodiment, the etch process comprises an anisotropic etch step that etches unmasked material portions of the electrically conductive material layer 118L into bit lines 118, which are patterned portions of the electrically conductive material layer 118L. In one embodiment, the bit lines 118 may have straight sidewalls that vertically extend from a horizontal plane including the top surface of the connection-level dielectric layer 90 to a respective one of the etch mask spacers 122. Inter-bit-line trenches 117 are formed between each neighboring pair of bit lines 118. In one embodiment, the straight sidewalls of the bit lines 118 may be formed with a taper angle in a range from 0.01 degree to 10 degrees, such as from 0.1 degree to 3 degrees. Thus, the bit lines 118 may have a variable width along the first horizontal direction hd1 that decreases with a vertical distance from the substrate (9, 10).

Figure 16F:
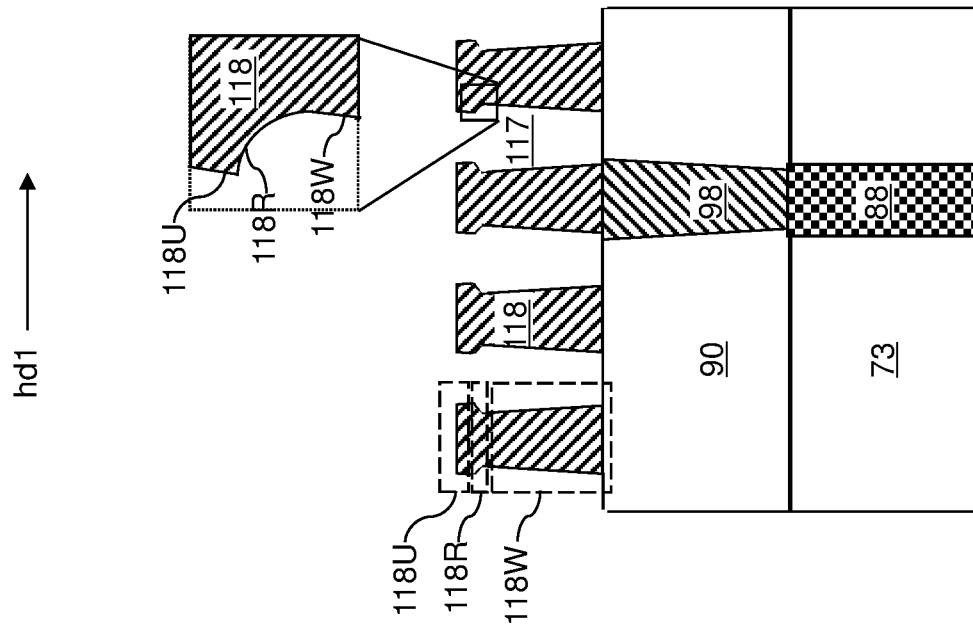
Figure 16E:
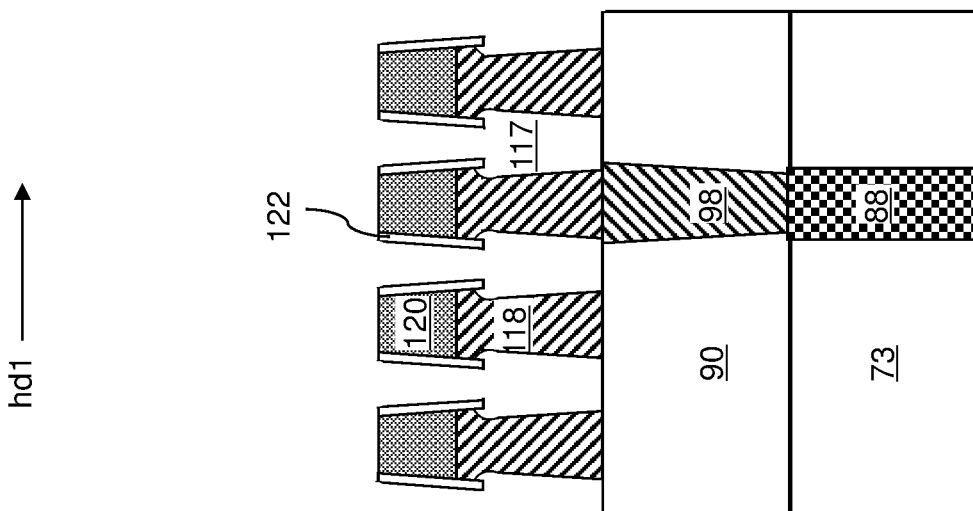

Referring to FIG. 16E, the etch process may further comprise a lateral recess etch step that laterally recesses the straight sidewalls of the bit lines 118 as formed by the anisotropic etch step of FIG. 16D. The combination of the bit-line-capping dielectric rails 120 and the etch mask spacers 122 may be employed as the composite etch mask during the lateral recess etch step. The chemistry of the lateral recess etch step may be selected so that that material of the bit lines 118 is laterally recessed selective to the material of the etch mask spacers 122. Each of the bit lines 118 may be formed with laterally recessed sidewalls that laterally extend along the second horizontal direction hd2 and are recessed relative to the etch mask spacers 122. The duration of the lateral recess etch step may be selected such that the width of each bottom surface of the bit lines 118 along the first horizontal direction hd1 may be in a range from 20% to 80%, such as from 40% to 60%, of the pitch of the one-dimensional array of bit-line-capping dielectric rails 120. The bit lines 118 may be formed as a one-dimensional periodic array of bit lines 118 having a pitch (i.e., periodicity) along the first horizontal direction hd1 that is the same as the pitch of the one-dimensional array of bit-line-capping dielectric rails 120.

In an alternative embodiment, the two step etch process that is performed during the steps of FIGS. 16D and 16E may comprise a single etch process including an anisotropic etch component and an isotropic etch component and forms the bit lines 118 with laterally recessed sidewalls. The bit lines 118 formed by the single etch process may have the same vertical cross-sectional profiles as the bit lines illustrated in FIG. 16E.

The bit-line-capping dielectric rails 120 can be located on a top surface of a respective one of the bit lines 118. In one embodiment, each of the bit-line-capping dielectric rails 120 may have a respective bottom surface that has a pair of lengthwise edges that coincides with a pair of lengthwise edges of a top surface of a respective underlying bit line 118 of the bit lines 118.

Referring to FIG. 16F, the etch mask spacers 122 can be removed by performing an etch process that removes the material of the etch mask spacers 122 selective to the material of the bit lines 118 and optionally selective to the material of the connection-level dielectric layer 90. The etch process may collaterally remove the bit-line-capping dielectric rails 120. Alternatively, an additional etch process may be performed prior to, or after, the etch process that etches the etch mask spacers 122 so that the bit-line-capping dielectric rails 120 are removed selective to the selective to the material of the bit lines 118 and optionally selective to the material of the connection-level dielectric layer 90. In one embodiment, the etch process(es) employed to remove the etch mask spacers 122 and the bit-line-capping dielectric rails 120 may comprise at least one wet etch process.

Generally, the bit lines 118 are electrically connected to the semiconductor devices (e.g., drain regions 63 of underlying vertical NAND strings) and have a respective reentrant vertical cross-sectional profile within a vertical plane that is perpendicular to a lengthwise direction along which the bit lines 118 laterally extend (such as within a vertical plane including the first horizontal direction hd1). As used herein, a "reentrant vertical cross-sectional profile" refers to a vertical cross-sectional profile including at least one sidewall having an upper laterally-protruding segment, a middle recessed segment adjoined to a bottom of the upper laterally-protruding segment, and a lower laterally-protruding segment that is adjoined to the middle recessed segment. In other words, each of the bit lines 118 may be roughly T-shaped or rook-shaped. According to an aspect of the present disclosure, each of the reentrant vertical cross-sectional profiles has a lower taper region 118W in which a width of a respective bit line 118 (such as the width along the first horizontal direction hd1) decreases with a vertical distance from the substrate (9, 10), a reverse-taper region 118R in which the width of the respective bit line 118 increases with the vertical distance from the substrate (9, 10), and an upper taper region 118U in which the width of the respective bit line 118 decreases with the vertical distance from the substrate (9, 10). The height of the lower taper region 118W within each bit line 118 may be in a range from 49% to 91% of the height of the bit line 118. The height of the reverse-taper region 118R within each bit line 118 may be in a range from 1% to 20% of the height of the bit line 118. The height of the upper taper region 118U within each bit line 118 may be in a range from 10% to 50% of the height of the bit lines 118.

In one embodiment, each of the reentrant vertical cross-sectional profiles comprises a pair of concave surface segments of a respective reverse-taper region 118R. In one embodiment, each of the reentrant vertical cross-sectional profiles comprises a pair of first straight tapered surface segments of a respective lower taper region 118W and a pair of second straight tapered surface segments of a respective upper taper region 118U. In one embodiment, the bit lines 118 may have a homogeneous metallic material composition throughout.

Referring to step 16G, a continuous dielectric material layer 130L can be formed by anisotropically depositing a dielectric material in the inter-bit-line trenches 117 and over the bit lines 118. The dielectric material of the continuous dielectric material layer 130L may comprise undoped silicate glass (i.e., silicon oxide), a doped silicate glass, a non-porous organosilicate glass, or an organosilicate glass. The anisotropic deposition of the dielectric material of the continuous dielectric material layer 130L may be performed by plasma-enhanced chemical vapor deposition (PECVD) process.

According to an aspect of the present disclosure, the reentrant profile of the bit lines 118 facilitate formation of air gaps (e.g., encapsulated cavities) 119 underneath the horizontal plane including the top surfaces of the bit lines 118 (i.e., below the cross bar of the T-shape/below the upper taper region 118U). The increase in the lateral spacing between an adjacent pair of bit lines 118 as a function of a downward distance from the horizontal plane including the top surfaces of the bit lines 118 increases the lateral dimension of gaps between neighboring pairs of deposited dielectric material portions within each inter-bit-line trench 117, and thus, formation of the air gaps 119 can be facilitated. Therefore, the width of the air gaps 119 can be increased. Thus, the effective dielectric constant of a region (i.e., the trench 117) between a neighboring pair of bit lines 118 can be decreased, which leads to a reduction in the RC delay of the bit lines. Each air gap 119 can be free of any solid phase material, and may consist of vacuum or a gas phase material (e.g., air). Generally, cavity-containing dielectric portions of the continuous dielectric material layer 130L can be interlaced with the bit lines 118 along the widthwise direction (such as the first horizontal direction hd1).

Figure 16G:
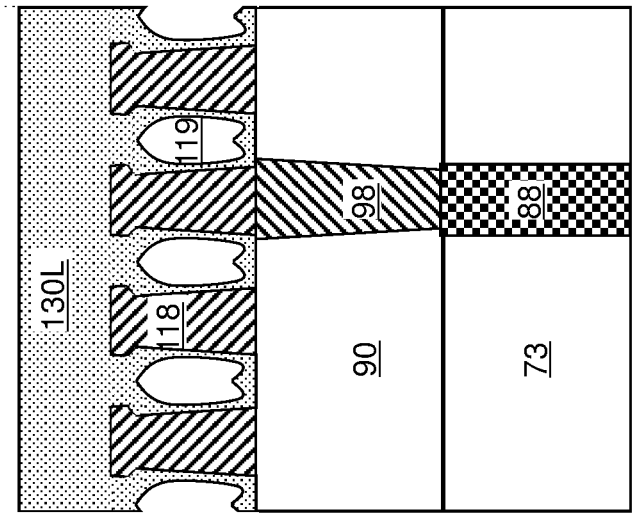
Figure 16H:
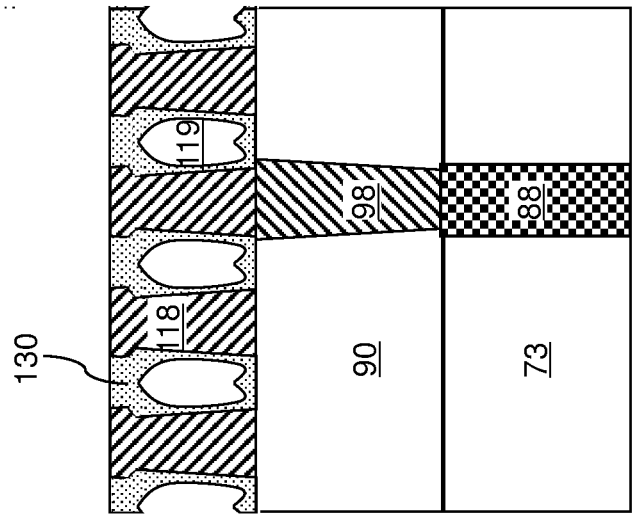

Referring to FIG. 16H, the anisotropically deposited dielectric material of the continuous dielectric material layer 130L can be planarized to remove portions of the continuous dielectric material layer 130L located above the horizontal plane including the top surfaces of the bit lines 118. Each remaining portion of the continuous dielectric material layer 130L located within a respective one of the inter-bit-line trenches 117 may comprise a cavity-containing dielectric portion, which is herein referred to as a cavity-containing dielectric rail 130. Each cavity-containing dielectric rail 130 may contain a respective air gap 119 that is surrounded by a respective continuous dielectric material portion of the rail 130 that encapsulates the air gap 119. Each cavity-containing dielectric rail 130 may have a top surface within a horizontal plane including top surfaces of the bit lines 118.

In one embodiment, the cavity-containing dielectric rails 130 may be interlaced with the bit lines 118 along a horizontal direction that is perpendicular to the lengthwise direction of the bit lines 118.

In this embodiment, at least one and/or each of the cavity-containing dielectric rails 130 comprises a dielectric encapsulation material portion in contact with sidewalls of a pair of bit lines 118 of the bit lines 118, and an air gap 119 comprising a volume of vacuum or a gas phase material encapsulated by the dielectric encapsulation material portion. In one embodiment, all surfaces of the air gap 119 coincide with inner surfaces of the dielectric encapsulation material portion. In other words, in this embodiment, the sidewalls of the bit lines 118 and/or the top surface of the connection-level dielectric layer 90 are not exposed to the air gap 119.

In this embodiment, bottom surfaces of the cavity-containing dielectric rails 130 are coplanar with bottom surfaces of the bit lines 118, and top surfaces of the cavity-containing dielectric rails 130 are coplanar with top surfaces of the bit lines 118. In this embodiment, each of the reentrant vertical cross-sectional profiles comprises a pair of concave surface segments of a respective reverse-taper region 118R is in contact with a pair of convex surface segments of a pair of cavity-containing dielectric rails 130 of the cavity-containing dielectric rails 130.

In this embodiment, each of the reentrant vertical cross-sectional profiles comprises a pair of first straight tapered surface segments of a respective lower taper region 118W in contact with a pair of first straight surface segments of the pair of cavity-containing dielectric rails 130, and a pair of second straight tapered surface segments of a respective upper taper region 118U in contact with a pair of second straight surface segments of the pair of cavity-containing dielectric rails 130.

Figure 17:
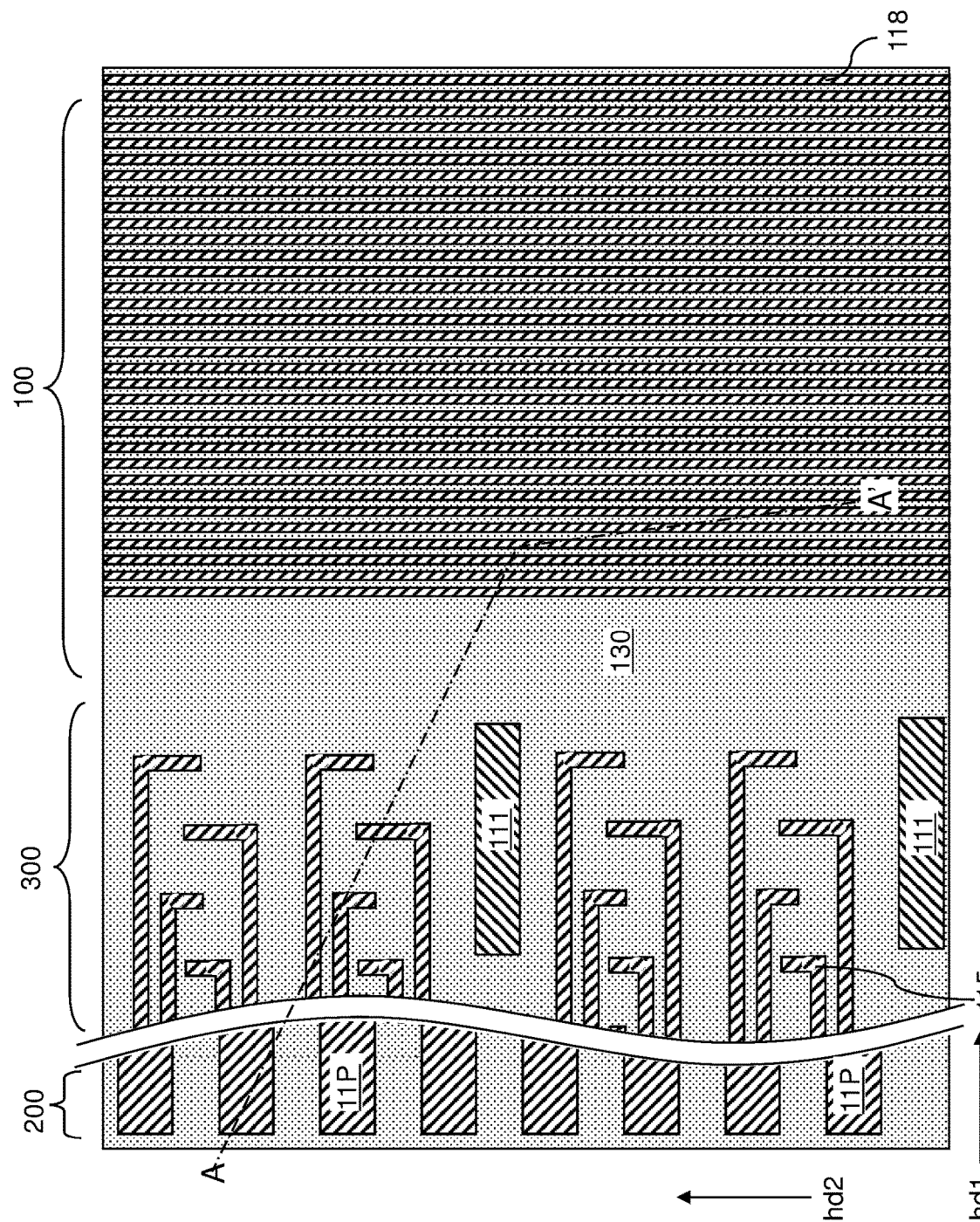
FIG. 17 is a top-down view of the exemplary structure at the processing steps of FIG. 16H.

Referring to FIG. 17, the processing steps of FIGS. 16A-16H can be employed to form additional bit-line-level metal interconnect structures (111, 115, 11P) in the contact region 300 and in the peripheral device region 200. The additional bit-line-level metal interconnect structures (111, 115, 11P) can include, for example, word-line-side connection line structures 115 contacting the word-line-side connection-level via structures 96, source-side connection line structures 111 contacting the source-side connection via structures 91, and peripheral connection line structures 11P contacting the peripheral-region connection via structures 9P.

Figure 18:
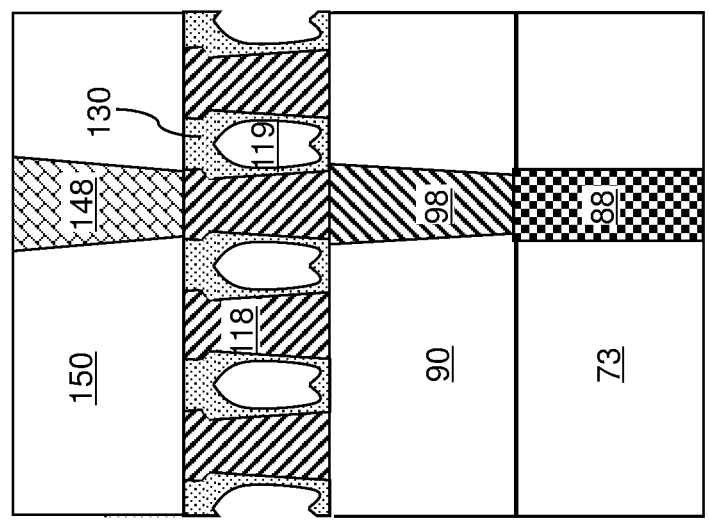
FIG. 18 is a vertical cross-sectional view of a region of the first configuration of the exemplary structure after formation of a via-level dielectric layer and bit-line-contact via structures according to the first embodiment of the present disclosure.

Referring to FIG. 18, an interconnect-level dielectric material layer can be deposited over the laterally alternating sequence of the bit lines 118 and the cavity-containing dielectric rails 130. The interconnect-level dielectric material layer is herein referred to as a via-level dielectric layer 150. The via-level dielectric layer 150 includes an interconnect-level dielectric (ILD) material such as undoped silicate glass (i.e., silicon oxide) or a doped silicate glass. Optionally, a dielectric liner (not illustrated) such as a silicon nitride liner or a dielectric metal oxide liner may be deposited prior to deposition of the via-level dielectric layer 150. The thickness of the via-level dielectric layer 150 can be in a range from 100 nm to 1,000 nm, such as from 200 nm to 500 nm, although lesser or greater thicknesses may also be employed.

A photoresist layer (not shown) can be applied over the via-level dielectric layer 150, and can be lithographically patterned to form openings over the bit lines 118. In one embodiment, the openings may be cylindrical openings or elongated openings that laterally extend along the second horizontal direction hd2 over the areas of the bit lines 118. An anisotropic etch process can be performed to transfer the pattern of the openings in the photoresist layer through the via-level dielectric layer 150. Bit-line-contact via cavities are formed in the via-level dielectric layer 150. The bit-line-contact via cavities may have any suitable shape, such as a cylindrical shape or an elongated shape which laterally extends along the second horizontal direction hd2 over the areas of the bit lines 118. A top surface of a bit line 118 is physically exposed at the bottom of each bit-line-contact via cavity. The photoresist layer can be subsequently removed, for example, by ashing.

At least one conductive material such as a combination of an optional metallic barrier liner and a metallic fill material layer can be deposited in the bit-line-contact via cavities. The metallic barrier liner may comprise a metallic nitride material such as TiN, TaN, and/or WN. The metallic fill material layer may comprise a metallic fill material such as W, Cu, Mo, Ru, Ti, Ta, Co, etc. Excess portions of the at least one conductive material can be removed from above the horizontal plane including the top surface of the via-level dielectric layer 150 by a planarization process such as a chemical mechanical polishing process. Each remaining portion of the at least one conductive material (which may be at least one metallic material) constitutes a bit-line-contact via structure 148, which may be a metallic via structure. Each bit-line-contact via structure 148 can contact a top surface of a respective one of the bit lines 118. Each bit-line-contact via structure 148 can have any suitable shape, such as a cylindrical shape (including a tapered cylindrical shape) or an elongated shape which laterally extends along the second horizontal direction hd2 over the areas of the bit lines 118.

Additional interconnect-level dielectric material layers and additional metal interconnect structures can be formed above the via-level dielectric layer 150 as needed.

Figures 19A, 19B:
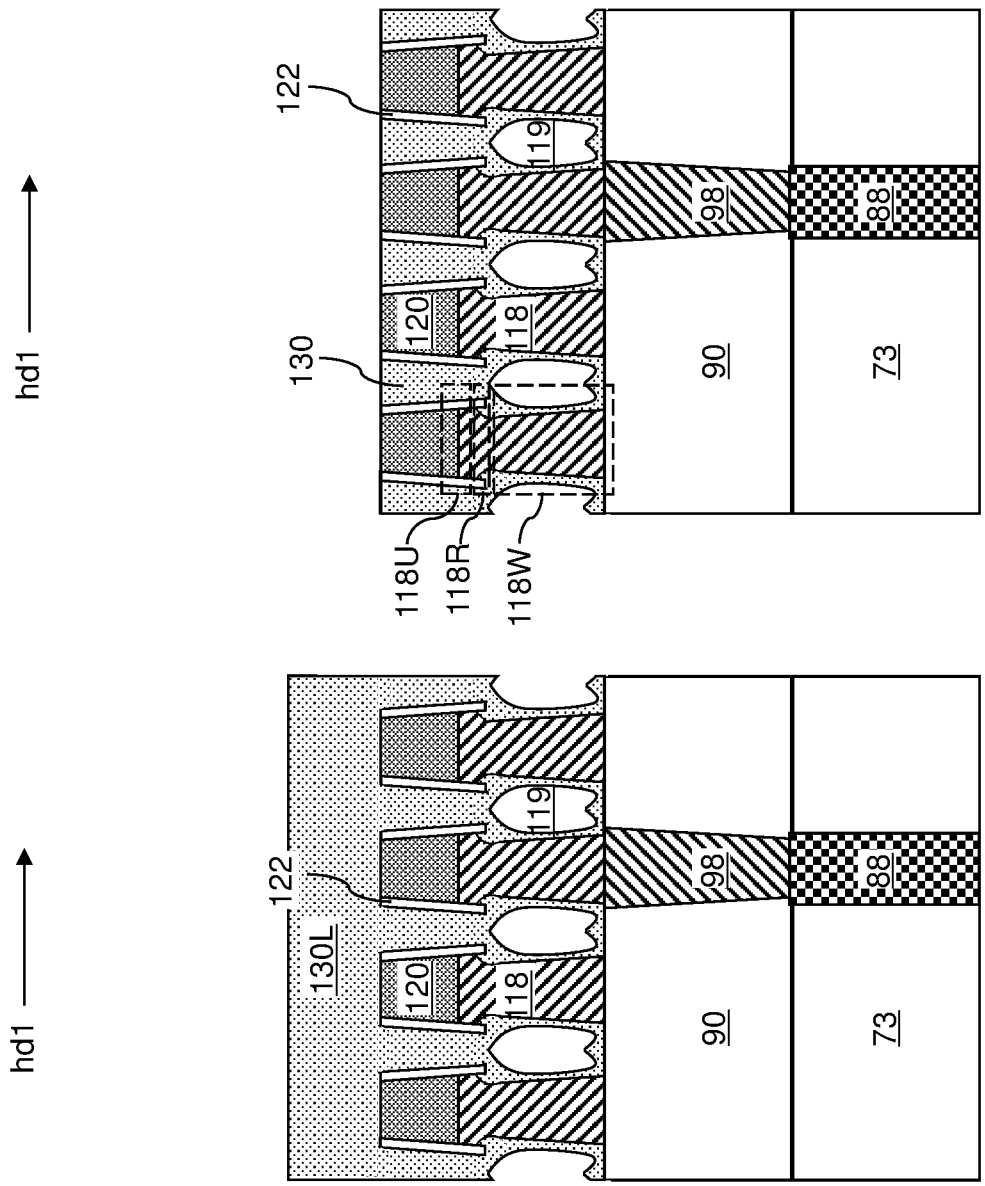
FIGS. 19A-19C are sequential vertical cross-sectional views of a region of a second configuration of the exemplary structure during formation of bit-line-level structures, a via-level dielectric layer, and bit-line-contact via structures according to a second embodiment of the present disclosure.
Figure 19C:
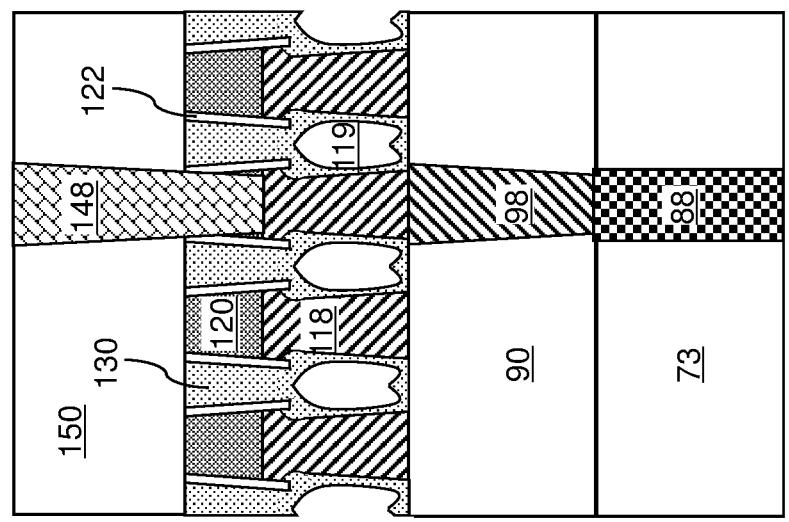

FIGS. 19A-19C are sequential vertical cross-sectional views of a region of a second configuration of the exemplary structure during formation of bit-line-level structures, a via-level dielectric layer 150, and bit-line-contact via structures 148 according to a second embodiment of the present disclosure.

Referring to FIG. 19A, the second configuration of the exemplary structure can be derived from the first configuration of the exemplary structure as illustrated in FIG. 16E by performing the processing steps of FIG. 16G without performing the processing steps of FIG. 16F. In other words, the second configuration of the exemplary structure illustrated in FIG. 19A can be derived from the first configuration of the exemplary structure illustrated in FIG. 16G by omitting the processing steps of FIG. 16F during the manufacture process. Thus, the bit-line-capping dielectric rails 120 and the etch mask spacers 122 are not removed, and are retained in the final device. The continuous dielectric material layer 130L is anisotropically deposited over the bit-line-capping dielectric rails 120 and the etch mask spacers 122.

Referring to FIG. 19B, the anisotropically deposited dielectric material of the continuous dielectric material layer 130L can be planarized employing the bit-line-capping dielectric rails 120 as stopping structures. Specifically, a planarization process (such as a chemical mechanical polishing process) can be performed to remove portions of the continuous dielectric material layer 130L located above the horizontal plane including the top surfaces of the bit-line-capping dielectric rails 120. Remaining portions of the continuous dielectric material layer 130L located between neighboring pairs of vertical stacks of a bit line 118 and a bit-line-capping dielectric rail 120 comprise cavity-containing dielectric rails 130. The cavity-containing dielectric rails 130 have top surfaces within a horizontal plane including top surfaces of the bit-line-capping dielectric rails 120.

In this embodiment, top surfaces of the cavity-containing dielectric rails 130 can be coplanar with top surfaces of the bit-line-capping dielectric rails 120. In this embodiment, top surfaces of the etch mask spacers 122 may be located within the horizontal plane including the top surfaces of the cavity-containing dielectric rails 130 and the bit-line-capping dielectric rails 120. The bit-line-capping dielectric rails 120 can be located on a top surface of a respective one of the bit lines 118. In one embodiment, each of the bit-line-capping dielectric rails 120 has a respective bottom surface that has a pair of lengthwise edges that coincides with a pair of lengthwise edges of a top surface of a respective underlying bit line 118 of the bit lines 118.

In this embodiment, each of the bit-line-capping dielectric rails 120 may be laterally spaced from a respective most proximal pair of cavity-containing dielectric rails 130 of the cavity-containing dielectric rails 130 by a respective pair of etch mask spacers 122, which may be a respective pair of dielectric spacers. In one embodiment, each of the bit-line-capping dielectric rails 120 may have a respective trapezoidal vertical cross-sectional shape so that the width of each bit-line-capping dielectric rail 120 along the first horizontal direction hd1 decreases with a vertical distance from the substrate (9, 10).

In one embodiment, the upper taper region 118U of each of the bit lines 118 comprises a respective pair of straight sidewall segments. In one embodiment, an entirety of each straight sidewall segment of the upper taper regions 118U of the bit lines 118 is in contact with a respective one of the etch mask spacers 122.

Referring to FIG. 19C, the processing steps of FIG. 18 can be performed to form a via-level dielectric layer 150 and a patterned photoresist layer including a pattern of via openings therein. The anisotropic etch process of FIG. 18 can be performed with a modification such that the bit-line-contact via cavities vertically extend through the via-level dielectric layer 150 and through a respective one of the bit-line-capping dielectric rails 120. A top surface of a bit line 118 can be physically exposed at the bottom of each of the bit-line-contact via cavities. At least one conductive material can be deposited in the bit-line-contact via cavities, and excess portions of the at least one conductive material can be removed from above the horizontal plane including the top surface of the via-level dielectric layer 150 by a planarization process. Remaining portions of the at least one conductive material filling the bit-line-contact via cavities comprise bit-line-contact via structures 148.

Figure 20A:
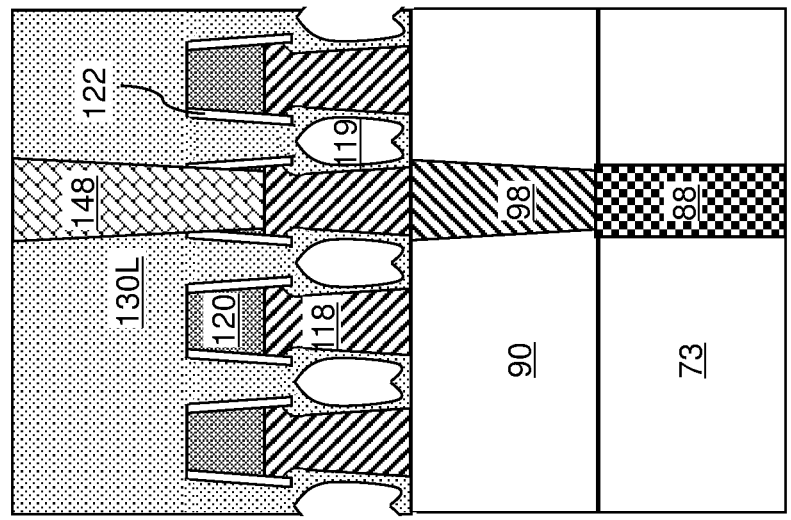
FIGS. 20A and 20B are sequential vertical cross-sectional views of a region of a third configuration of the exemplary structure during formation of bit-line-level structures and bit-line-contact via structures according to a third embodiment of the present disclosure.
Figure 20B:
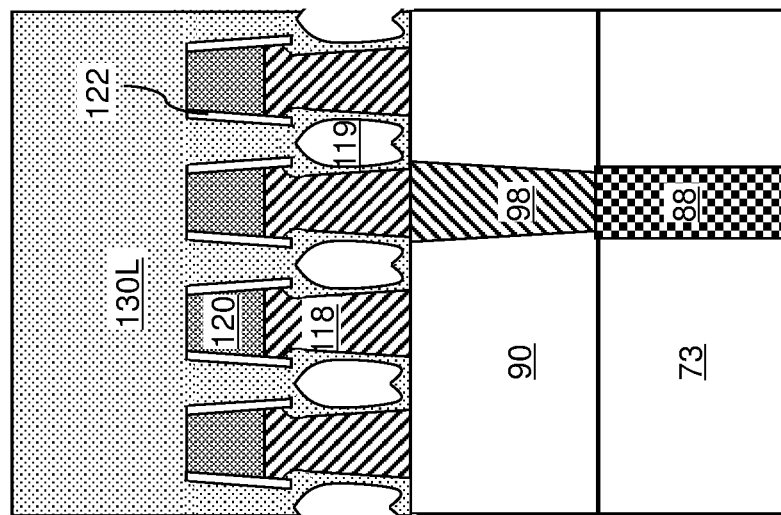

FIGS. 20A and 20B are sequential vertical cross-sectional views of a region of a third configuration of the exemplary structure during formation of bit-line-level structures and bit-line-contact via structures according to a third embodiment of the present disclosure.

Referring to FIG. 20A, the third configuration of the exemplary structure may be the same as, or may be derived from, the second configuration of the exemplary structure illustrated in FIG. 19A. An anisotropically deposited dielectric material forms a continuous dielectric material layer 130L comprising a horizontally-extending portion overlying the bit-line-capping dielectric rails 120. In this case, the thickness of a horizontally-extending portion of the continuous dielectric material layer 130L located above the horizontal plane including the top surfaces of the bit-line-capping dielectric rails 120 may be optimized for formation of bit-line-contact via structures through the horizontally-extending portion of the continuous dielectric material layer 130L and the bit-line-capping dielectric rails 120. For example, the thickness of the horizontally-extending portion of the continuous dielectric material layer 130L located above the horizontal plane including the top surfaces of the bit-line-capping dielectric rails 120 may be in a range from 50 nm to 1,000 nm, such as from 200 nm to 500 nm, although lesser or greater thicknesses may also be employed. In this embodiment, the planarization of the continuous dielectric material layer 130L shown in FIG. 19B is either omitted or conducted such that a portion of the continuous dielectric material layer 130L remains above the top surfaces of the bit lines 118 and the bit-line-capping dielectric rails 120.

Cavity-containing dielectric material portions are formed between neighboring pairs of vertical stacks of a bit line 118 and a bit-line-capping dielectric rail 120. The cavity-containing dielectric material portions are downward-protruding portions of the continuous dielectric material layer 130L. In one embodiment, an entirety of each straight sidewall segment of the upper taper regions 118U of the bit lines 118 can be in contact with a respective one of the etch mask spacers 122.

Referring to FIG. 20B, the processing steps of FIG. 18 can be performed with modifications. Specifically, deposition of a via-level dielectric layer 150 can be omitted. A patterned photoresist layer having a same pattern as the patterned photoresist layer employed at the processing steps of FIG. 18 or FIG. 19C can be formed, and an anisotropic etch process can be performed to transfer the pattern in the patterned photoresist layer through the horizontally-extending portion of the continuous dielectric material layer 130L and through a respective one of the bit-line-capping dielectric rails 120.

Figure 20C:
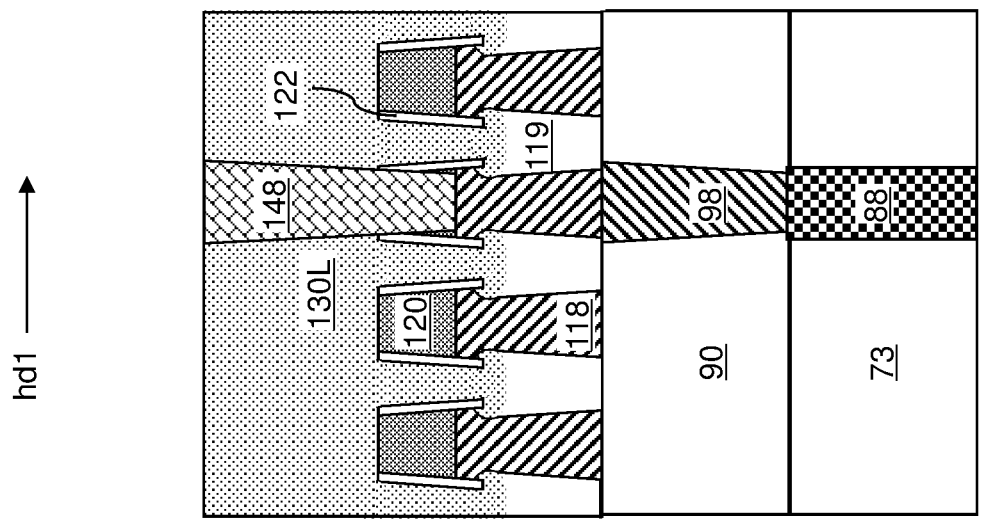
FIG. 20C is a vertical cross-sectional view of a region of an alternative third configuration of the exemplary structure during formation of bit-line-level structures and bit-line-contact via structures according to an alternative configuration of the third embodiment of the present disclosure

In an alternative configuration of the third embodiment shown in FIG. 20C, the continuous dielectric material layer 130L may be deposited by a selective dielectric on dielectric deposition method. In this configuration, the continuous dielectric material layer 130L does not contact the lower portions of sidewalls of the bit lines 118 or the top surface of the connection-level dielectric layer 90 exposed between the bit lines 118. This forms larger sized air gaps 119. In this embodiment, at least the lower portions of the sidewalls of the bit lines 118 and/or the top surface of the connection-level dielectric layer 90 are exposed to the air gap 119.

Referring collectively to FIGS. 1-20C and according to various embodiments of the present disclosure, a semiconductor structure is provided, which comprises: semiconductor devices located over a substrate (9, 10); bit lines 118 electrically connected to the semiconductor devices and having a respective reentrant vertical cross-sectional profile within a vertical plane that is perpendicular to a lengthwise direction along which the bit lines 118 laterally extend, and cavity-containing dielectric portions containing air gaps 119 that are interlaced with the bit lines 118 along a horizontal direction (such as a first (i.e., word line) horizontal direction hd1) that is perpendicular to the lengthwise direction (such as a second (i.e., bit line) horizontal direction hd2).

The cavity-containing dielectric portions may comprise the cavity-containing dielectric rails 130, or may comprise the cavity-containing vertically-extending dielectric portions of a continuous dielectric material layer 130L that includes a horizontally-extending portion. The air gaps 119 are entirely or partially encapsulated by the cavity-containing dielectric portions.

In one embodiment, each of the bit line 118 reentrant vertical cross-sectional profiles has a lower taper region 118W in which a width of a respective bit line 118 decreases with a vertical distance from the substrate (9, 10), a reverse-taper region 118R in which the width of the respective bit line 118 increases with the vertical distance from the substrate (9, 10), and an upper taper region 118U in which the width of the respective bit line 118 decreases with the vertical distance from the substrate (9, 10).

In one embodiment, each of the air gaps 119 is located entirely below the upper taper region 118U of the bit lines 118 (i.e., entire volume of the air gaps 119 is below the cross bar of the T-shaped bit lines 118).

In one embodiment, each of the reentrant vertical cross-sectional profiles comprises a pair of concave surface segments of a respective reverse-taper region 118R that is in contact with a pair of convex surface segments of a pair of cavity-containing dielectric portions of the cavity-containing dielectric portions.

In one embodiment, each of the reentrant vertical cross-sectional profiles further comprises: a pair of first straight tapered surface segments of a respective lower taper region 118W in contact with a pair of first straight surface segments of the pair of cavity-containing dielectric portions; and a pair of second straight tapered surface segments of a respective upper taper region 118U in contact with a pair of second straight surface segments of the pair of cavity-containing dielectric portions.

In another embodiment shown in FIG. 20C, each of the reentrant vertical cross-sectional profiles further comprises a pair of first straight tapered surface segments of a respective lower taper region 118W exposed to the air gaps 119; and a pair of second straight tapered surface segments of a respective upper taper region 118U in contact with a pair of second straight surface segments of the pair of cavity-containing dielectric portions.

In one embodiment, bottom surfaces of the cavity-containing dielectric portions are coplanar with bottom surfaces of the bit lines 118. In one embodiment, top surfaces of the cavity-containing dielectric portions are coplanar with top surfaces of the bit lines 118.

In one embodiment, the semiconductor structure comprises bit-line-capping dielectric rails 120 located on top surfaces of the bit lines 118. In one embodiment, each of the bit-line-capping dielectric rails 120 has a respective bottom surface that has a pair of lengthwise edges that coincides with a pair of lengthwise edges of a top surface of a respective underlying bit line 118 of the bit lines 118. In one embodiment, each of the bit-line-capping dielectric rails 120 is laterally spaced from a respective most proximal pair of cavity-containing dielectric portions of the cavity-containing dielectric portions by a respective pair of etch mask spacers 122.

In one embodiment, the upper taper region 118U of each of the bit lines 118 comprises a respective pair of straight sidewall segments; and an entirety of each straight sidewall segment of the upper taper region 118Us of the bit lines 118 is in contact with a respective one of the etch mask spacers. In one embodiment, top surfaces of the cavity-containing dielectric portions are coplanar with top surfaces of the bit-line-capping dielectric rails 120. In one embodiment, the cavity-containing dielectric material portions are downward-protruding portions of a continuous dielectric material layer 130L comprising a horizontally-extending portion overlying the bit-line-capping dielectric rails 120.

FIGS. 21A-21E are sequential vertical cross-sectional views of a region of a fourth configuration of the exemplary structure during formation of bit-line-level structures, a via-level dielectric layer, and bit-line-contact via structures according to a fourth embodiment of the present disclosure. In this embodiment, the air gaps 119 are optional and may be present or omitted.

Figure 21A:
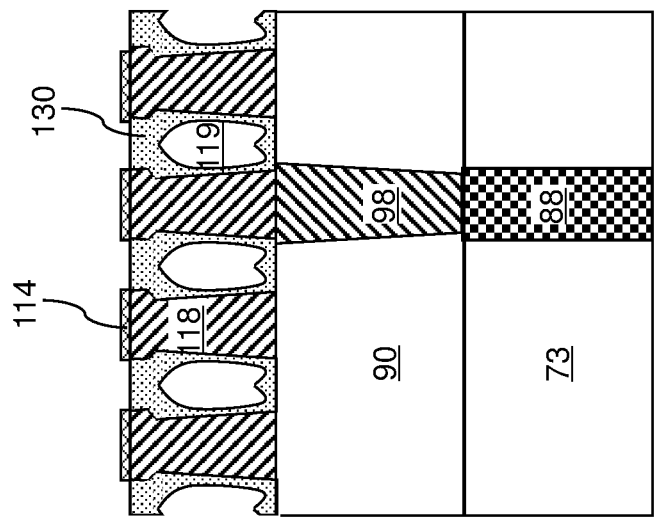
FIGS. 21A-21E are sequential vertical cross-sectional views of a region of a fourth configuration of the exemplary structure during formation of bit-line-level structures, a via-level dielectric layer, and bit-line-contact via structures according to a fourth embodiment of the present disclosure.

Referring to FIG. 21A, the fourth configuration of the exemplary structure can be the same as the first configuration of the exemplary structure as illustrated in FIG. 16H. Generally, a laterally alternating sequence of bit lines 118 and dielectric rails (such as cavity-containing dielectric rails 130 containing air gaps 119 or solid dielectric rails which lack air gaps and which fill the entire volume of the trenches 117) can be formed over semiconductor devices over a substrate (9, 10). The bit lines 118 can be electrically connected to a respective node (e.g., drain region 63) of the semiconductor devices, and can have a respective reentrant vertical cross-sectional profile within a vertical plane that is perpendicular to a lengthwise direction along which the bit lines 118 laterally extend. The dielectric rails (such as the cavity-containing dielectric rails 130 containing the air gaps 119 or solid dielectric rails which lack air gaps) are interlaced with the bit lines 118 along a horizontal direction that is perpendicular to the lengthwise direction, such as along the first horizontal direction hd1.

Figure 21B:
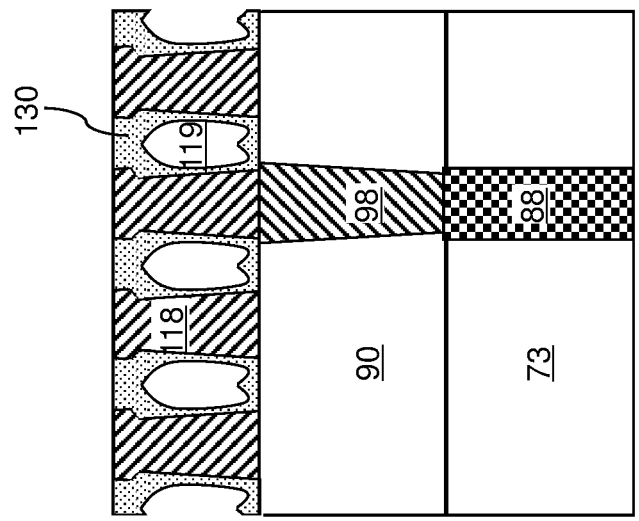

Referring to FIG. 21B, nucleation suppression strips 114 may optionally be formed on the physically exposed surfaces (e.g., top surface) of the bit lines 118. The nucleation suppression strips 114 comprise a material which suppresses nucleation of a dielectric cap material thereupon during a subsequent dielectric cap material deposition process. If the metallic material of the bit lines 118 does not provide sufficient suppression of deposition of a dielectric cap material thereupon, then the nucleation suppression strips 114 provide sufficient suppression of nucleation of a dielectric cap material during a subsequent dielectric cap material deposition process. Thus, the nucleation suppression strips 114 reduce or prevent deposition of the dielectric cap material over the areas of the bit lines 118. The nucleation suppression strips 114 may be selectively formed on the physically exposed surfaces of the bit lines 118 without deposition of the nucleation suppression material on the physically exposed surfaces of the dielectric rails (such as the cavity-containing dielectric rails 130). Thus, the nucleation suppression strips 114 may be formed as discrete strips that are located on a top surface of a respective one of the bit lines 118.

In one embodiment, the nucleation suppression material may comprise a monolayer of an organic (i.e., carbon based) self-assembled material (SAM) which can be selectively deposited on the metallic material of the bit lines 118 and which inhibit deposition of a dielectric material thereon. For example the SAM may comprise an alkane thiol having a chemical formula of $CH_3(CH_2)_{n-1}SH$ or $OH(CH_2)_{n-1}SH$ having a thiol (e.g., sulfur containing) head group configured to selectively attach to (i.e., having an affinity to) the metal bit lines 118 (e.g., copper or tungsten bit lines), a $CH_2$ backbone, and a methyl ($CH_3$) or a hydroxide (OH) tail group configured to inhibit silicon oxide deposition thereon.

Figure 21C:
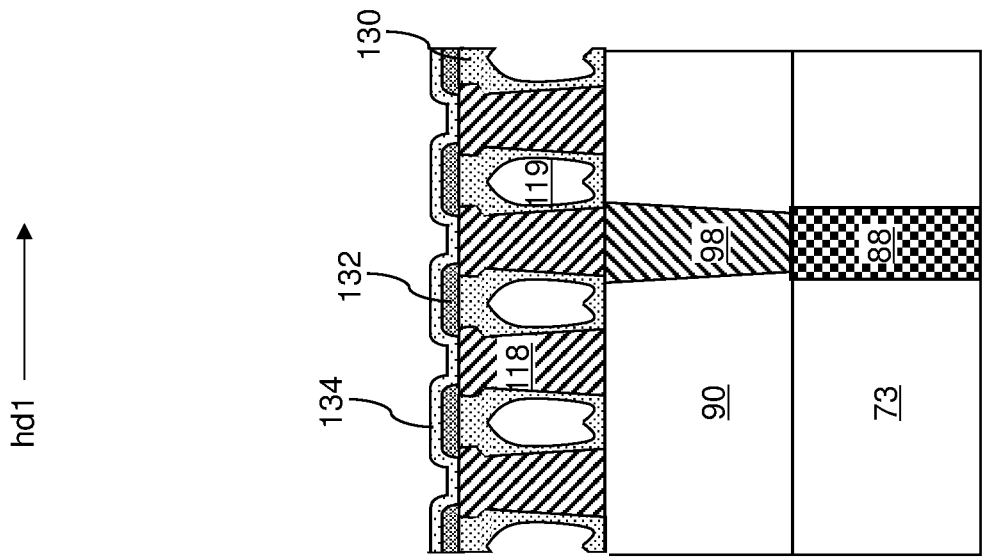

Referring to FIG. 21C, dielectric cap strips 132 can be formed on top surface of the dielectric rails (such as the cavity-containing dielectric rails 130 or solid dielectric rails) by selectively growing a dielectric cap material from physically exposed surfaces of the dielectric rails using selective dielectric on dielectric deposition. The nucleation suppression strips 114 (if present) suppress growth of the dielectric cap material from metallic surfaces such as the surfaces of the bit lines 118. In one embodiment, an atomic layer deposition (ALD) may be employed to selectively grow the dielectric cap material. The dielectric cap material comprises a material that is different from the material of the dielectric rails (such as the cavity-containing dielectric rails 130). For example, the material of the dielectric rails (such as the cavity-containing dielectric rails 130) may comprise porous organosilicate glass, non-porous organosilicate glass, undoped silicate glass (i.e., silicon oxide), a doped silicate glass, and the dielectric cap material of the dielectric cap strips 132 may comprise a dielectric material that is different from the material of the dielectric rails and selected from silicon nitride, silicon oxide, and a dielectric metal oxide (such as aluminum oxide).

Subsequently, the nucleation suppression strips 114 can be removed selective to the materials of the dielectric cap strips 132 and the bit lines 118, for example, by performing an etch process such as a wet etch process or a burnout process. Alternatively, the nucleation suppression strips may be evaporated during the dielectric cap strip 132 deposition process.

According to an aspect of the present disclosure, the duration of the selective deposition process (such as the number of cycles in an atomic layer deposition process) can be selected such that the dielectric cap strips 132 cover peripheral regions of the top surfaces of the bit lines 118, and do not cover middle regions of the top surfaces of the bit lines 118. Thus, a middle strip portion of the top surface of each bit line 118 is not covered by the dielectric cap strips 132.

In one embodiment, top surfaces of the dielectric rails (such as the cavity-containing dielectric rails 130) are located within a horizontal plane including top surfaces of the bit lines 118. In one embodiment, lengthwise edges of the dielectric cap strips 132 are laterally offset by a lateral offset distance "lod" from a most proximal lengthwise top edge of a bit line 118. In one embodiment, the growth of the dielectric cap strips 132 from the physically exposed surfaces of the dielectric rails may be isotropic, and each of the dielectric cap strips 132 may have a thickness "t" that is the same as the lateral offset distance lod. In one embodiment, the thickness and the lateral offset distance lod of the dielectric cap strips 132 may be in a range from 1 nm to 30 nm, such as from 3 nm to 10 nm, although lesser and greater dimensions may also be employed.

In one embodiment, each of the dielectric cap strips 132 may have a pair of convex top surface segments that are adjoined to a planar top surface segment and laterally extend along the lengthwise direction.

Figure 21D:
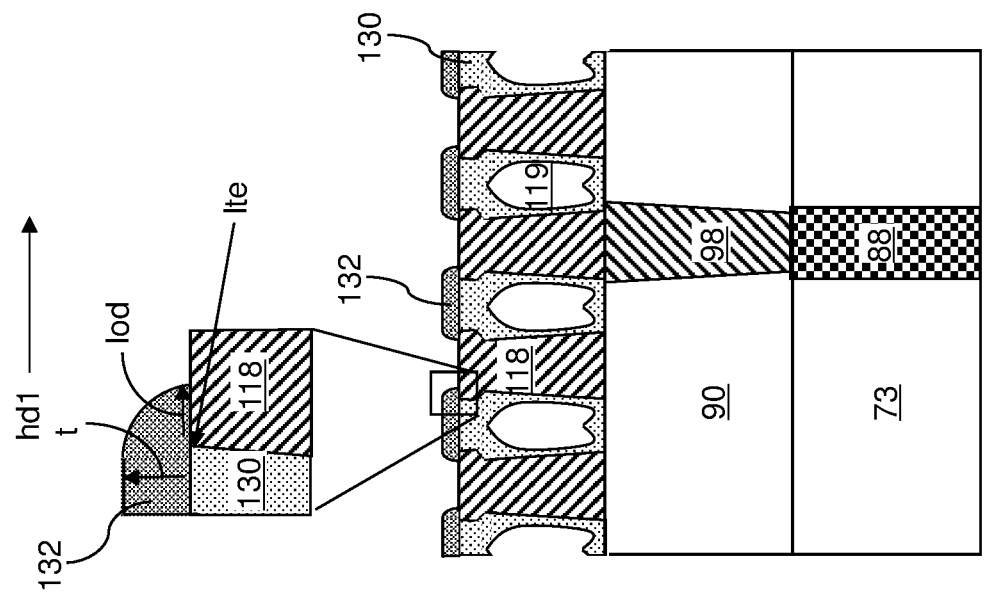

Referring to FIG. 21D, a dielectric cover layer 134 may be optionally deposited over the dielectric cap strips 132 and the bit lines 118. The dielectric cover layer 134, if present, includes a dielectric material that can be more easily etched selective to the dielectric cap material of the dielectric cap strips 132. The dielectric cover layer 134 contacts top surfaces of the dielectric cap strips 132 and top surfaces of the bit lines 118.

Figure 21E:
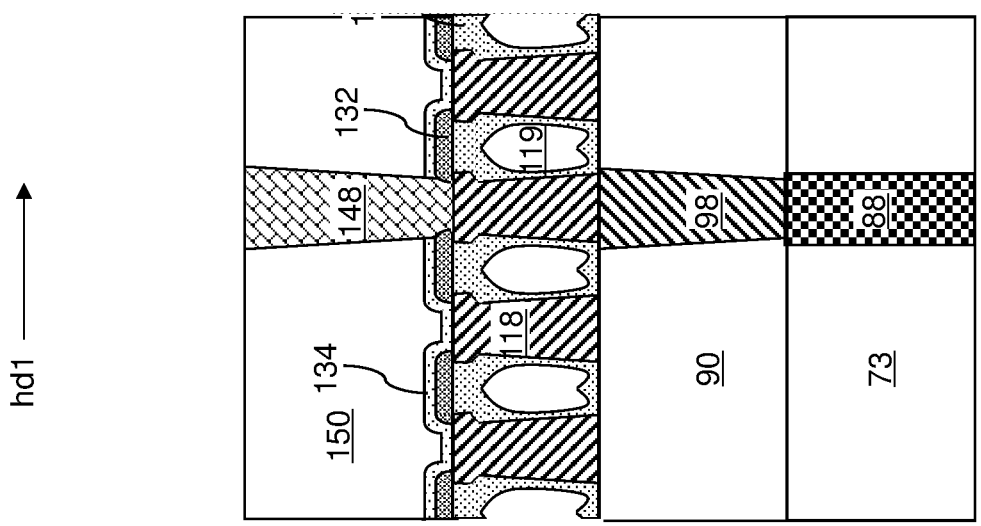

Referring to FIG. 21E, an interconnect-level dielectric material layer can be deposited over the dielectric cap strips 132 and the bit lines 118, and the optional dielectric cover layer 134. The interconnect-level dielectric material layer is herein referred to as a via-level dielectric layer 150. The via-level dielectric layer 150 includes an interconnect-level dielectric (ILD) material such as undoped silicate glass (i.e., silicon oxide) or a doped silicate glass. Optionally, a dielectric liner (not illustrated) such as a silicon nitride liner or a dielectric metal oxide liner may be deposited prior to deposition of the via-level dielectric layer 150. The thickness of the via-level dielectric layer 150 can be in a range from 100 nm to 1,000 nm, such as from 200 nm to 500 nm, although lesser or greater thicknesses may also be employed.

A photoresist layer (not shown) can be applied over the via-level dielectric layer 150, and can be lithographically patterned to form openings over the bit lines 118. In one embodiment, the openings may be cylindrical openings or elongated openings that laterally extend along the second horizontal direction hd2 over the areas of the bit lines 118. An anisotropic etch process can be performed to transfer the pattern of the openings in the photoresist layer through the via-level dielectric layer 150 and the optional dielectric cover layer 134.

According to an aspect of the present disclosure, the anisotropic etch process can have an etch chemistry that etches the materials of the via-level dielectric layer 150 and the optional dielectric cover layer 134 selective to the dielectric cap material of the dielectric cap strips 132. In one embodiment, the via-level dielectric layer 150 and the optional dielectric cover layer 134 may comprise a high-etch-rate dielectric material such as a porous organosilicate glass or a non-porous organosilicate glass, and the dielectric cap strips 132 may comprise, and/or may consist essentially of, a low-etch-rate dielectric material such as silicon oxide, silicon nitride, or a dielectric metal oxide (such as aluminum oxide). Thus, the dielectric cap strips 132 function as self-aligned etch masks during the anisotropic etch process.

Bit-line-contact via cavities are formed in the via-level dielectric layer 150. The bit-line-contact via cavities may have any suitable shape, such as a cylindrical shape or an elongated shape which laterally extends along the second horizontal direction hd2 over the areas of the bit lines 118. According to an aspect of the present disclosure, the periphery of a bottom surface of each bit-line-contact via cavity may have a pair of lengthwise sidewalls that are parallel to the lengthwise direction of the bit lines 118 and are laterally offset from the peripheries of the bit lines by the lateral offset distance lod. A top surface of a bit line 118 is physically exposed at the bottom of each bit-line-contact via cavity. The photoresist layer can be subsequently removed, for example, by ashing.

At least one conductive material such as a combination of an optional metallic barrier liner and a metallic fill material layer can be deposited in the bit-line-contact via cavities. The metallic barrier liner may comprise a metallic nitride material such as TiN, TaN, and/or WN. The metallic fill material layer may comprise a metallic fill material such as W, Cu, Mo, Ru, Ti, Ta, Co, etc. Excess portions of the at least one conductive material can be removed from above the horizontal plane including the top surface of the via-level dielectric layer 150 by a planarization process such as a chemical mechanical polishing process. Each remaining portion of the at least one conductive material (which may be at least one metallic material) constitutes a bit-line-contact via structure 148, which may be a metallic via structure. Each bit-line-contact via structure 148 can contact a top surface of a respective one of the bit lines 118. Each bit-line-contact via structure 148 can have any suitable shape, such as a cylindrical shape (including a tapered cylindrical shape) or an elongated shape which laterally extends along the second horizontal direction hd2 over the areas of the bit lines 118.

Additional interconnect-level dielectric material layers and additional metal interconnect structures can be formed above the via-level dielectric layer 150 as needed.

Figure 22:
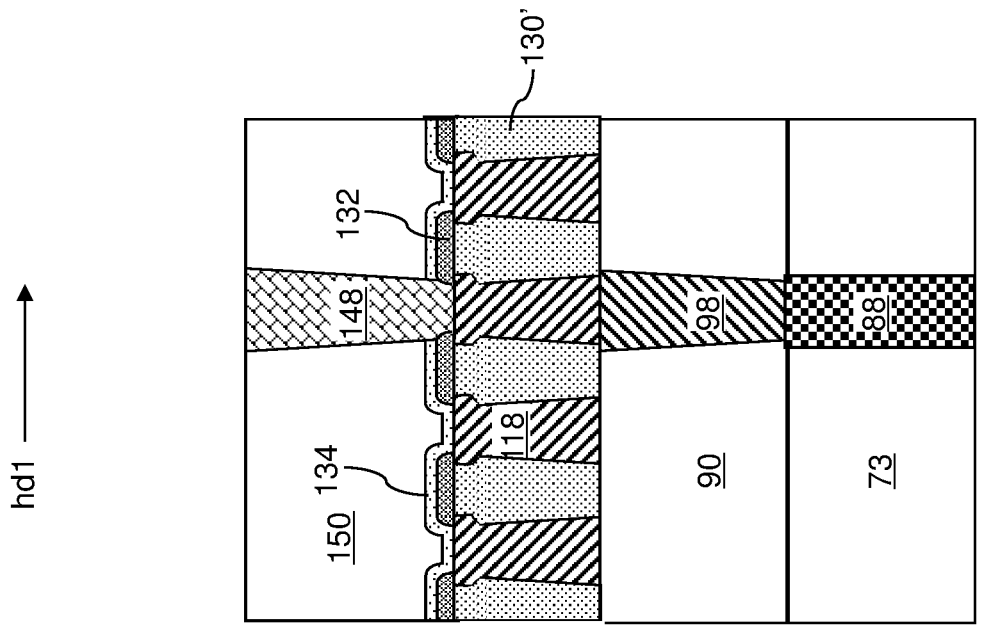
FIG. 22 is an alternative embodiment of the fourth configuration of the exemplary structure.

Referring to FIG. 22, an alternative embodiment of the fourth configuration of the exemplary structure can be derived from the fourth configuration of the exemplary structure by forming solid dielectric rails 130' that do not include air gaps 119 therein. The solid dielectric rails 130' that do not include air gaps therein may be formed, for example, by employing a combination of a deposition process for the dielectric fill material at the processing step that deposits the material of the dielectric rails and a reflow process that induces reflow of the dielectric fill material so that the air gaps are removed from the dielectric rails 130'. Alternatively or additionally, a combination of at least two dielectric fill material deposition processes and at least one anisotropic etch process may be employed to remove upper portions of a previously-deposited dielectric fill material and to widen an upper portion of each remaining cavity before depositing a next dielectric fill material.

Referring collectively to FIGS. 21A and 22 and according to various embodiments of the present disclosure, a semiconductor structure is provided, which comprises: semiconductor devices located over a substrate (9, 10); bit lines 118 electrically connected to the semiconductor devices and having a respective reentrant vertical cross-sectional profile within a vertical plane that is perpendicular to a lengthwise direction (such as a second horizontal direction hd2) along which the bit lines 118 laterally extend; dielectric rails (130 or 130') that are interlaced with the bit lines 118 along a horizontal direction (such as a first horizontal direction hd1) that is perpendicular to the lengthwise direction; and dielectric cap strips 132 located on top surface of the dielectric rails (130 or 130') and covering peripheral regions of the top surfaces of the bit lines 118 and not covering middle regions of the top surfaces of the bit lines 118.

In one embodiment, the semiconductor structure comprises: a via-level dielectric layer 150 overlying the dielectric cap strips 132; and a bit-line-contact via structure 148 vertically extending through the via-level dielectric layer 150 and contacting a top surface of one of the bit lines 118. In one embodiment, the bit-line-contact via structure 148 comprises a straight sidewall segment in contact with the via-level dielectric layer 150 and a pair of concave sidewall segments in contact with convex sidewall segments of a pair of dielectric cap strips 132 of the dielectric cap strips 132.

In one embodiment, each of the reentrant vertical cross-sectional profiles has a lower taper region 118W in which a width of a respective bit line 118 decreases with a vertical distance from the substrate (9, 10), a reverse-taper region 118R in which the width of the respective bit line 118 increases with the vertical distance from the substrate (9, 10), and an upper taper region 118U in which the width of the respective bit line 118 decreases with the vertical distance from the substrate (9, 10).

In one embodiment, the dielectric rails 130 comprise cavity-containing dielectric rails 130 containing air gaps 119. In one embodiment, each of the air gaps 119 is located entirely below the upper taper region 118U of the bit lines 118 (i.e., entire volume of the air gaps 119 is below the cross bar of the T-shaped bit lines 118).

In one embodiment, each of the reentrant vertical cross-sectional profiles comprises a pair of concave surface segments of a respective reverse-taper region 118R that is in contact with a pair of convex surface segments of a pair of cavity-containing dielectric portions of the cavity-containing dielectric portions.

The various embodiments of the present disclosure can be employed to form bit lines 118 having reentrant vertical cross-sectional profiles. The reentrant shape of the bit lines results in air gaps 119 at a lower level between the bit lines 118 (e.g., below the cross bar of the T-shaped bit lines). This reduces the probability that the bit-line-contact via structures 148 will break through into the air gaps 119 and short circuit adjacent bit lines 118. Forming the air gaps 119 at a lower height (using a re-entrant type structure at the top) allows for better etch margin during the bit-line contact via etch process. The reentrant vertical cross-sectional profiles are also conducive to formation of larger air gaps 119 between the bit lines 118 which reduces the bit line RC delay. Alternatively or additionally, a selective dielectric deposition process may be employed to form dielectric cap strips 132, which can be employed to form self-aligned contact structures, such as the bit-line-contact via structures 148 illustrated in FIGS. 21C and 22.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
semiconductor devices located over a substrate;
bit lines electrically connected to the semiconductor devices and having a respective reentrant vertical cross-sectional profile within a vertical plane that is perpendicular to a lengthwise direction along which the bit lines laterally extend;
dielectric rails that are interlaced with the bit lines along a horizontal direction that is perpendicular to the lengthwise direction; and
dielectric cap strips located on top surface of the dielectric rails and covering peripheral regions of the top surfaces of the bit lines and not covering middle regions of the top surfaces of the bit lines;
wherein top surfaces of the dielectric rails are located within a horizontal plane including top surfaces of the bit lines; and
wherein lengthwise edges of the dielectric cap strips are laterally offset by a lateral offset distance from a most proximal lengthwise top edge of lengthwise top edges of the bit lines.

2. The semiconductor structure of claim 1, wherein each of the dielectric cap strips has a thickness that is the same as the lateral offset distance.

3. A semiconductor structure, comprising:
semiconductor devices located over a substrate;
bit lines electrically connected to the semiconductor devices and having a respective reentrant vertical cross-sectional profile within a vertical plane that is perpendicular to a lengthwise direction along which the bit lines laterally extend;
dielectric rails that are interlaced with the bit lines along a horizontal direction that is perpendicular to the lengthwise direction; and
dielectric cap strips located on top surface of the dielectric rails and covering peripheral regions of the top surfaces of the bit lines and not covering middle regions of the top surfaces of the bit lines;
wherein top surfaces of the dielectric rails are located within a horizontal plane including top surfaces of the bit lines; and
wherein each of the dielectric cap strips has a pair of convex top surface segments that are adjoined to a planar top surface segment and laterally extend along the lengthwise direction.

4. A semiconductor structure, comprising:
semiconductor devices located over a substrate;
bit lines electrically connected to the semiconductor devices and having a respective reentrant vertical cross-sectional profile within a vertical plane that is perpendicular to a lengthwise direction along which the bit lines laterally extend;
dielectric rails that are interlaced with the bit lines along a horizontal direction that is perpendicular to the lengthwise direction;
dielectric cap strips located on top surface of the dielectric rails and covering peripheral regions of the top surfaces of the bit lines and not covering middle regions of the top surfaces of the bit lines;
a via-level dielectric layer overlying the dielectric cap strips; and
a bit-line-contact via structure vertically extending through the via-level dielectric layer and contacting a top surface of one of the bit lines;
wherein the bit-line-contact via structure comprises a straight sidewall segment in contact with the via-level dielectric layer and a pair of concave sidewall segments in contact with convex sidewall segments of a pair of dielectric cap strips of the dielectric cap strips.

5. A semiconductor structure, comprising:
semiconductor devices located over a substrate;
bit lines electrically connected to the semiconductor devices and having a respective reentrant vertical cross-sectional profile within a vertical plane that is perpendicular to a lengthwise direction along which the bit lines laterally extend;
dielectric rails that are interlaced with the bit lines along a horizontal direction that is perpendicular to the lengthwise direction; and
dielectric cap strips located on top surface of the dielectric rails and covering peripheral regions of the top surfaces of the bit lines and not covering middle regions of the top surfaces of the bit lines;
wherein each of the reentrant vertical cross-sectional profiles has a lower taper region in which a width of a respective bit line decreases with a vertical distance from the substrate, a reverse-taper region in which the width of the respective bit line increases with the vertical distance from the substrate, and an upper taper region in which the width of the respective bit line decreases with the vertical distance from the substrate.

6. The semiconductor structure of claim 3, wherein:
the dielectric rails comprise cavity-containing dielectric rails containing air gaps; and
each of the air gaps is located entirely below the upper taper region of the bit lines.

7. The semiconductor structure of claim 6, wherein each of the reentrant vertical cross-sectional profiles comprises a pair of concave surface segments of a respective reverse-taper region that is in contact with a pair of convex surface segments of a pair of cavity-containing dielectric portions of the cavity-containing dielectric portions.

8. The semiconductor structure of claim 7, wherein each of the reentrant vertical cross-sectional profiles further comprises:
a pair of first straight tapered surface segments of a respective lower taper region in contact with a pair of first straight surface segments of the pair of cavity-containing dielectric portions; and
a pair of second straight tapered surface segments of a respective upper taper region in contact with a pair of second straight surface segments of the pair of cavity-containing dielectric portions.

9. The semiconductor structure of claim 7, wherein each of the reentrant vertical cross-sectional profiles further comprises:
a pair of first straight tapered surface segments of a respective lower taper region exposed to the air gaps; and
a pair of second straight tapered surface segments of a respective upper taper region in contact with a pair of second straight surface segments of the pair of cavity-containing dielectric portions.

10. A semiconductor structure, comprising:
semiconductor devices located over a substrate;
bit lines electrically connected to the semiconductor devices and having a respective reentrant vertical cross-sectional profile within a vertical plane that is perpendicular to a lengthwise direction along which the bit lines laterally extend;
dielectric rails that are interlaced with the bit lines along a horizontal direction that is perpendicular to the lengthwise direction; and
dielectric cap strips located on top surface of the dielectric rails and covering peripheral regions of the top surfaces of the bit lines and not covering middle regions of the top surfaces of the bit lines;
wherein the dielectric rails comprise solid dielectric rails containing no air gaps.

* * * * *